(12) United States Patent
Cho

(10) Patent No.: US 11,081,531 B2
(45) Date of Patent: Aug. 3, 2021

(54) ORGANIC LIGHT EMITTING DIODE DISPLAY DEVICE

(71) Applicant: SAMSUNG DISPLAY CO., LTD., Yongin-si (KR)

(72) Inventor: Wonje Cho, Osan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/714,217

(22) Filed: Dec. 13, 2019

(65) Prior Publication Data

US 2020/0286964 A1 Sep. 10, 2020

(30) Foreign Application Priority Data

Mar. 4, 2019 (KR) .................. 10-2019-0024746

(51) Int. Cl.
*H01L 27/32* (2006.01)

(52) U.S. Cl.
CPC ...... *H01L 27/3218* (2013.01); *H01L 27/3234* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 2013/0147851 A1* | 6/2013 | Yim | G09G 3/2074 345/690 |
| 2017/0053971 A1* | 2/2017 | Sato | H01L 51/5275 |
| 2017/0070679 A1* | 3/2017 | Chung | G06F 1/1605 |

FOREIGN PATENT DOCUMENTS

KR 10-2018-0061474 6/2018
KR 10-2018-0100140 9/2018

* cited by examiner

*Primary Examiner* — Nicholas J Tobergte
*Assistant Examiner* — Kien C Ly
(74) *Attorney, Agent, or Firm* — F. Chau & Associates, LLC

(57) ABSTRACT

An organic light emitting diode display device includes a lower substrate, a plurality of lower electrodes, a light emitting layer, an upper electrode, and a first functional module. The lower substrate includes a first module region that includes sub-pixel regions and transmissive regions, and a display region that surrounds the first module region and includes the sub-pixel regions. The lower electrodes are respectively disposed on the lower substrate in the sub-pixel regions in the first module region. The light emitting layer is disposed on the lower electrodes, and includes a first opening between two adjacent lower electrodes. The upper electrode is disposed on the light emitting layer, and includes a second opening that overlaps the first opening. The first functional module is disposed on a bottom surface of the lower substrate in the first module region.

18 Claims, 30 Drawing Sheets

ORGANIC LIGHT EMITTING DIODE DISPLAY DEVICE

CROSS-REFERENCE TO RELATED APPLICATION

This application claims priority under 35 U.S.C. § 119 from, and the benefit of, Korean Patent Application No. 10-2019-0024746, filed on Mar. 4, 2019 in the Korean Intellectual Property Office (KIPO), the contents of which are herein incorporated by reference in their entirety.

BACKGROUND

1. Technical Field

Exemplary embodiments relate generally to an organic light emitting diode display device. More particularly, embodiments of the present inventive concept relate to an organic light emitting diode display device including a functional module.

2. Discussion of the Related Art

Flat panel display devices have replaced cathode ray tube display devices due to their light weight and thin characteristics thereof. Representative examples of such flat panel display devices include a liquid crystal display device and an organic light emitting diode display device.

Recently, an organic light emitting diode display device that can display an image through an entire front surface of the organic light emitting diode display device has been developed. In this case, the OLED display device may include a functional module. For example, the functional module may be a camera module that acquires an image of an object located on the front surface of the OLED display device, a face recognition sensor module that detects a face of a user, a pupil recognition sensor module that detects a pupil of the user, an acceleration sensor module and a geomagnetic sensor module that detects movement of the OLED display device, a proximity sensor module and an infrared sensor module that detects proximity with respect to a front side of the OLED display device, an illumination sensor module that measures brightness when left in a pocket or a bag, etc.

For a functional module to be included in an OLED display device, an opening is formed in a part of the OLED display device, and the functional module is disposed in the opening. In this case, an image is not displayed at the part where the opening is formed, and the OLED display device can be damaged in a process of forming the opening.

SUMMARY

Some exemplary embodiments provide an organic light emitting diode display device that includes a functional module.

According to some exemplary embodiments, an organic light emitting diode display device includes a lower substrate, a plurality of lower electrodes, a light emitting layer, an upper electrode, and a first functional module. The lower substrate includes a first module region that includes sub-pixel regions and transmissive regions, and a display region that surrounds the first module region and includes the sub-pixel regions. The lower electrodes are respectively disposed on the lower substrate in the sub-pixel regions included in the first module region. The light emitting layer is disposed on the lower electrodes, and has a first opening between two adjacent lower electrodes. The upper electrode is disposed on the light emitting layer, and has a second opening that overlaps the first opening. The first functional module is disposed on a bottom surface of the lower substrate in the first module region.

In exemplary embodiments, the first and second openings may be located in the transmissive regions in the first module region.

In exemplary embodiments, the organic light emitting diode display device may further include a planarization layer and a pixel defining layer. The planarization layer may be disposed on the lower substrate. The pixel defining layer may be disposed on the planarization layer to cover both sides of each of the lower electrodes in the first module region, and may include an opening that exposes a top surface of the planarization layer in each of the transmissive regions in the first module region.

In exemplary embodiments, the first and second openings may expose the top surface of the planarization layer in each of the transmissive regions in the first module region.

In exemplary embodiments, the organic light emitting diode display device may further include a lower spacer disposed on the planarization layer in each of the transmissive regions in the first module region.

In exemplary embodiments, the first and second openings may expose a top surface of the lower spacer, and the top surface of the lower spacer may be located at a same level as a top surface of the pixel defining layer. The light emitting layer and the upper electrode may be disposed on at least a part of a side surface of the lower spacer.

In exemplary embodiments, the organic light emitting diode display device may further include an upper spacer disposed on the lower spacer. The first and second openings may expose a top surface of the upper spacer, and the top surface of the upper spacer may be located at a higher level than a top surface of the pixel defining layer. The light emitting layer and the upper electrode may be disposed on at least a part of a side surface of each of the lower and upper spacers.

In exemplary embodiments, the lower substrate may further include a second module region spaced apart from the first module region and that includes the transmissive region, and the display region may surround the second module region.

In exemplary embodiments, the organic light emitting diode display device may further include a second functional module disposed on the bottom surface of the lower substrate in the second module region. The transmissive region of the second module region may correspond to the second functional module.

In exemplary embodiments, the first functional module may be one of a face recognition sensor module, a pupil recognition sensor module, an acceleration sensor module, a proximity sensor module, an infrared sensor module, or an illuminance sensor module, and the second functional module may be a camera module.

In exemplary embodiments, the light emitting layer may include a third opening in the second module region, and the upper electrode may include a fourth opening in the second module region that overlaps the third opening. The organic light emitting diode display device may further include a planarization layer disposed on the lower substrate and a pixel defining layer disposed on the planarization layer in the display region adjacent to the second module region.

In exemplary embodiments, the third and fourth openings may expose a top surface of the planarization layer located in the second module region.

In exemplary embodiments, the organic light emitting diode display device may further include a lower structure disposed on the planarization layer in the second module region.

In exemplary embodiments, the third and fourth openings may expose a top surface of the lower structure, and the top surface of the lower structure may be located at a same level as a top surface of the pixel defining layer. The light emitting layer and the upper electrode may be disposed on at least a part of a side surface of the lower structure.

In exemplary embodiments, the organic light emitting diode display device of claim may further include an upper structure disposed on the lower structure. The first and second openings may expose a top surface of the upper structure, and the top surface of the upper structure may be located at a higher level than a top surface of the pixel defining layer. The light emitting layer and the upper electrode may be disposed on at least a part of a side surface of each of the lower and upper structures.

In exemplary embodiments, an image may be displayed in the first module region and the display region, and the image might not be displayed in the second module region.

In exemplary embodiments, the organic light emitting diode display device may further include a plurality of semiconductor elements disposed between the lower substrate and the light emitting layer. No semiconductor elements are disposed in the transmissive regions and the second module region.

In exemplary embodiments, the organic light emitting diode display device may further include a gate insulating layer disposed on the lower substrate, an insulating interlayer disposed on the gate insulating layer, a planarization layer disposed on the insulating interlayer, and an upper substrate disposed on the planarization layer to face the lower substrate. External light may be incident onto the first functional module by propagating through the upper substrate, the first and second openings, the planarization layer, the insulating interlayer, the gate insulating layer, and the lower substrate in the first module region.

According to some exemplary embodiments, an organic light emitting diode display device includes a lower substrate, a plurality of lower electrodes, a light emitting layer, and an upper electrode. The lower substrate includes a first module region, a second module region and a display region that surrounds the first module region and the second module region. The first module region includes sub-pixel regions and transmissive regions, the second module region includes the transmissive region, and the display region includes the sub-pixel regions. The plurality of lower electrodes are disposed on a top surface of the lower substrate in the sub-pixel regions in the first module region, respectively. The light emitting layer is disposed on the lower electrodes and includes a first opening formed between two adjacent lower electrodes. The upper electrode is disposed on the light emitting layer and includes a second opening that overlaps the first opening. The first and second openings are located in the transmissive regions in the first module region.

In exemplary embodiments, the organic light emitting diode display device may further include a first functional module disposed on a bottom surface of the lower substrate in the first module region; and second functional module disposed on the bottom surface of the lower substrate in the second module region. The second module region may be spaced apart from the first module region, and the transmissive region of the second module region may correspond to the second functional module.

As an organic light emitting diode display device according to exemplary embodiments includes a first module region that includes sub-pixel regions and transmissive regions and a second module region that includes transmissive regions, a first functional module and a second functional module can be included in an OLED display device without forming an opening in the OLED display device.

In addition, since the sub-pixel regions are included in the first module region, an image can be displayed in the first module region. Moreover, since a light emitting layer and an upper electrode are omitted from the transmissive regions in the first module region and the second module region, external light can easily propagate to the first functional module and the second functional module. Accordingly, the first functional module and the second functional module can detect the surrounding environment of the first surface of the OLED display device or can acquire an image of an object.

DETAILED DESCRIPTION OF EXEMPLARY EMBODIMENTS

Hereinafter, exemplary embodiments of the present inventive concept will be described in detail with reference to the accompanying drawings.

Figure 1:
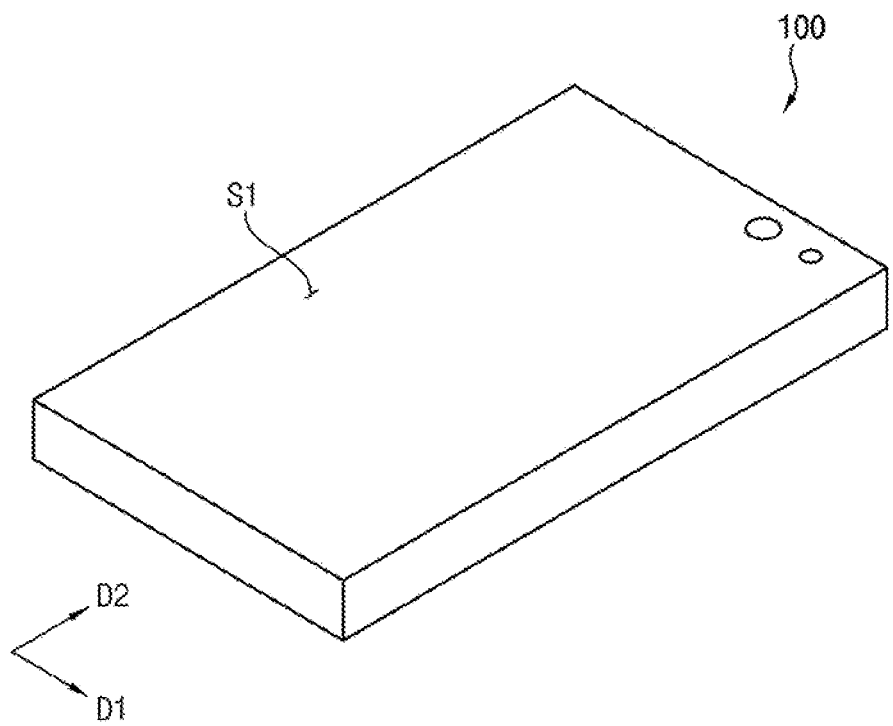
FIG. 1 is a perspective view of an organic light emitting diode display device according to exemplary embodiments of the present disclosure.
Figure 2:
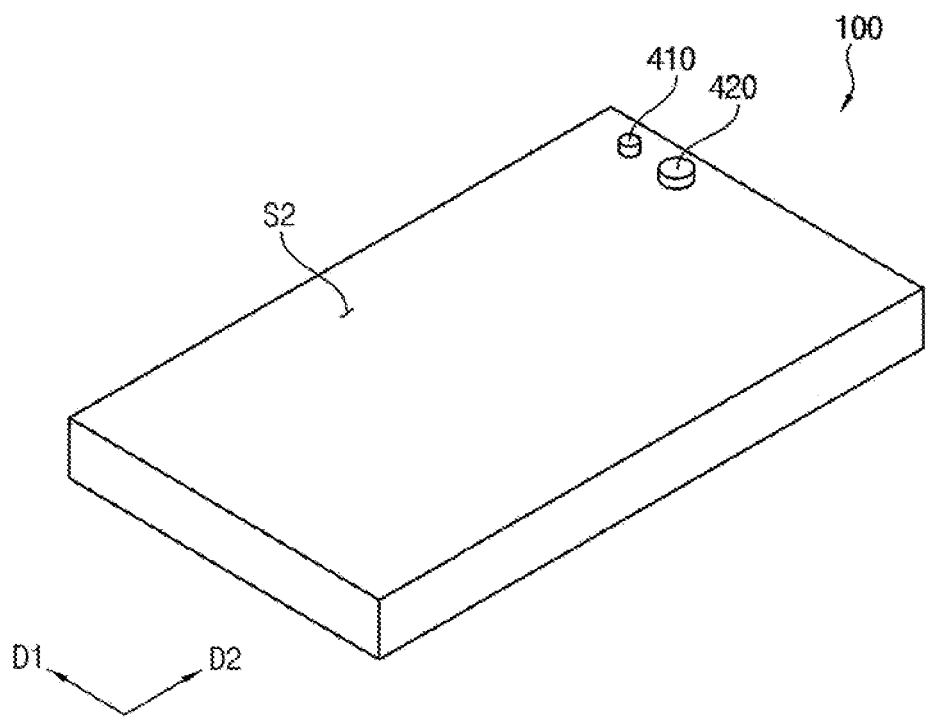
FIG. 2 is a perspective view of functional modules disposed on a rear surface of an OLED display device of FIG. 1.
Figure 3:
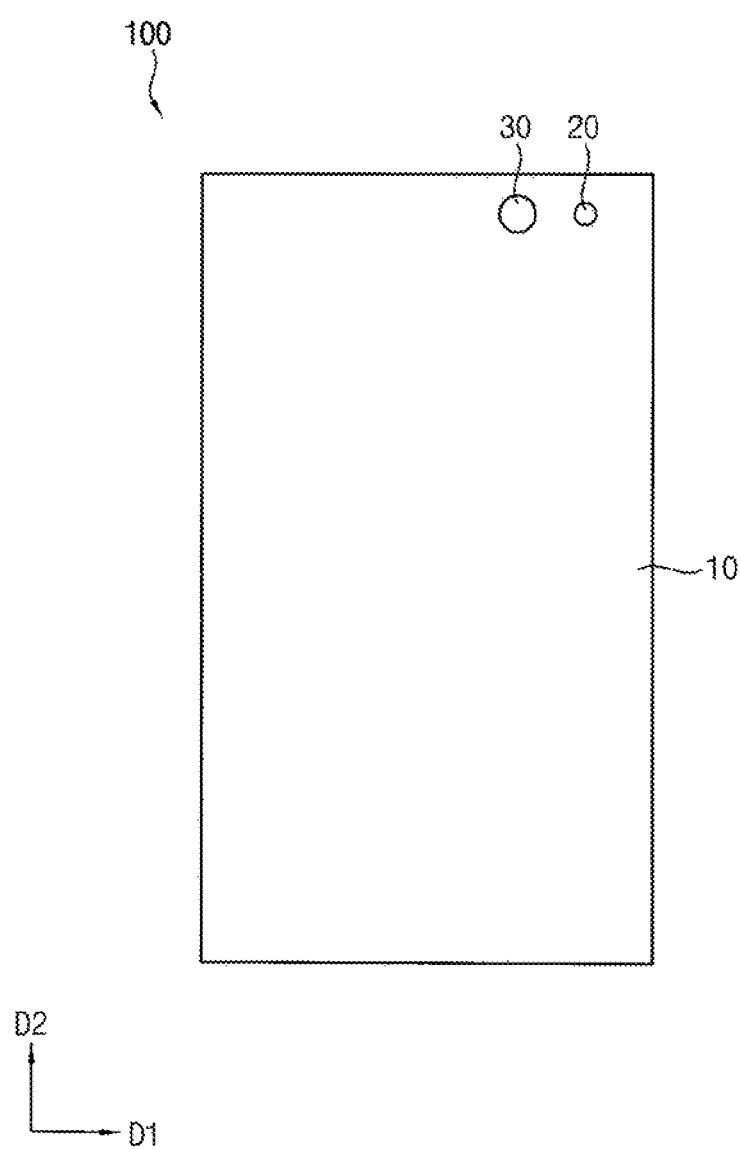
FIGS. 3 and 4 are plan views that illustrate a display region, a first module region, and a second module region of an OLED display device of FIG. 1.
Figure 4:
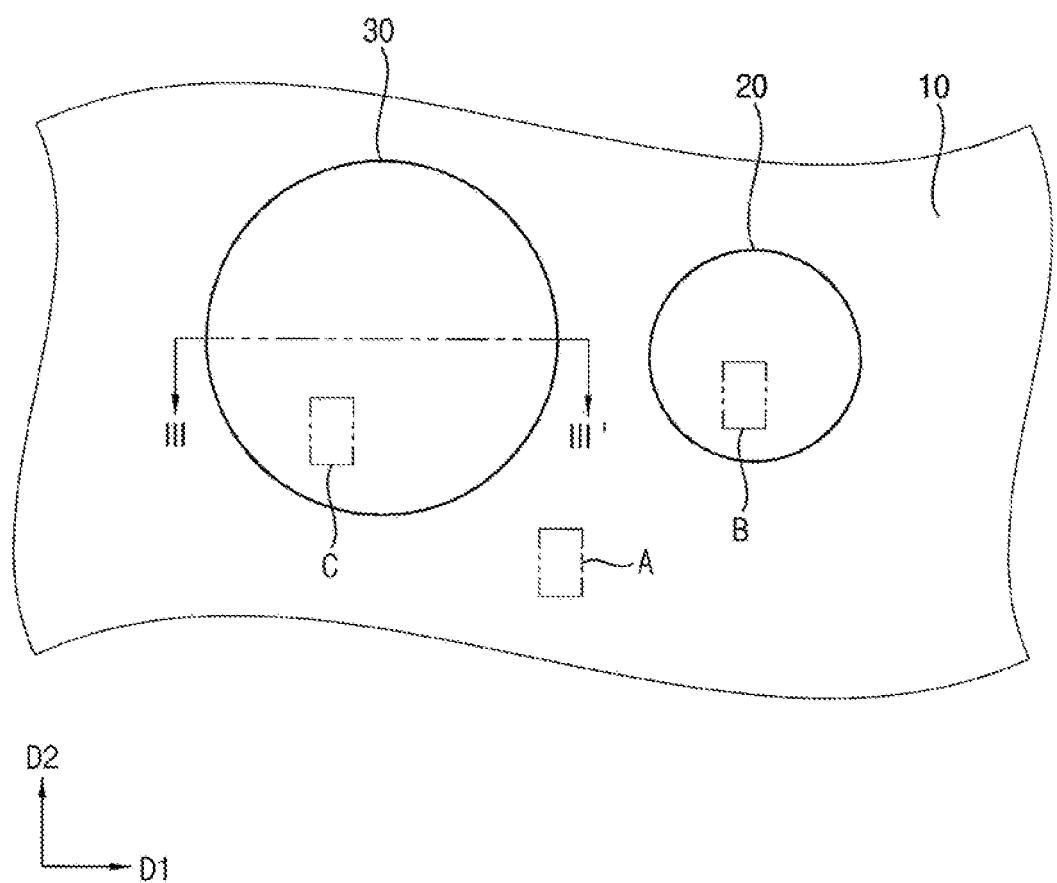

FIG. 1 is a perspective view of an organic light emitting diode display device according to exemplary embodiments of the present disclosure, FIG. 2 is a perspective view of functional modules disposed on a rear surface of an OLED display device of FIG. 1, and FIGS. 3 and 4 are plan views that illustrate a display region, a first module region, and a second module region of an OLED display device of FIG. 1.

Referring to FIGS. 1 to 4, according to an embodiment, an organic light emitting diode display device 100 includes a lower substrate, such as lower substrate 110 shown in FIGS. 9, 10, and 11, which will be described below, an upper substrate, such as upper substrate 450 shown in FIGS. 9, 10, and 11, which will be described below, a first functional module 410, a second functional module 420, etc. The OLED display device 100 has a first surface S1 that can display an image and a second surface S2 opposite to the first surface S1. For example, a top surface of the upper substrate may correspond to the first surface S1, and a bottom surface of the lower substrate may correspond to the second surface S2. The first surface S1 and the second surface S2 are each parallel to a plane defined by a first direction D1 and a second direction D2 orthogonal to the first direction D1. The first functional module 410 and the second functional module 420 are disposed on one side of the second surface S2 of the OLED display device 100, and the first functional module 410 and the second functional module 420 are spaced apart from each other by a predetermined interval.

As shown in FIGS. 3 and 4, according to an embodiment, the OLED display device 100 includes a display region 10, a first module region 20, and a second module region 30. In this case, the first and second module regions 20 and 30 are located on one side of the first surface S1 of the OLED display device 100, and the first module region 20 and the second module region 30 are spaced apart from each other by a predetermined interval. In addition, the display region 10 surrounds the first module region 20 and the second module region 30, and an area of the display region 10 is greater than an area of each of the first and second module regions 20 and 30. In exemplary embodiments, the first functional module 410 is disposed on a bottom surface S2 of the OLED display device 100 such that the first functional module 410 corresponds to the first module region 20, and the second functional module 420 is disposed on the bottom surface S2 of the OLED display device 100 such that the second functional module 420 corresponds to the second module region 30.

Figure 5:
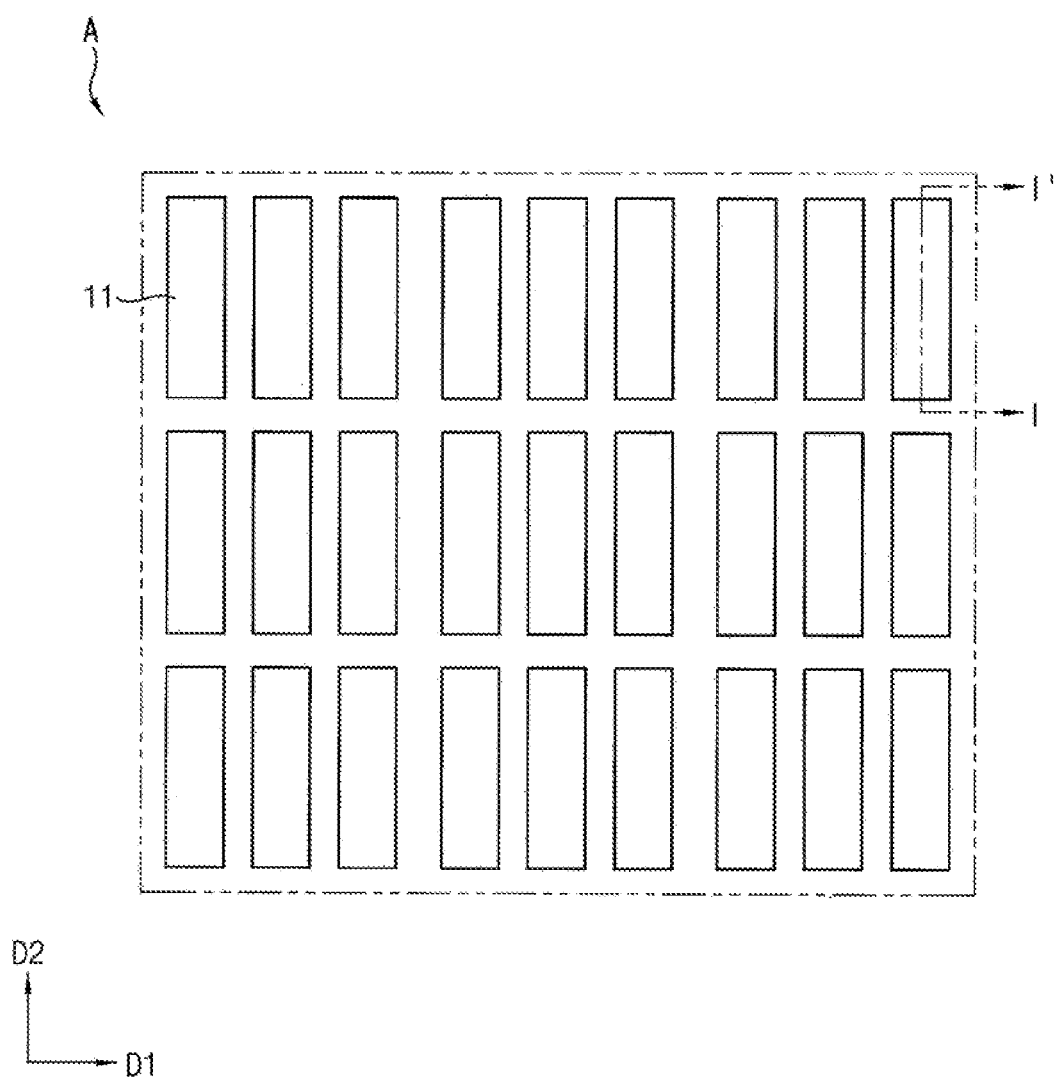
FIG. 5 is a partially enlarged plan view of a portion 'A' of a display region of FIG. 4.
Figure 6:
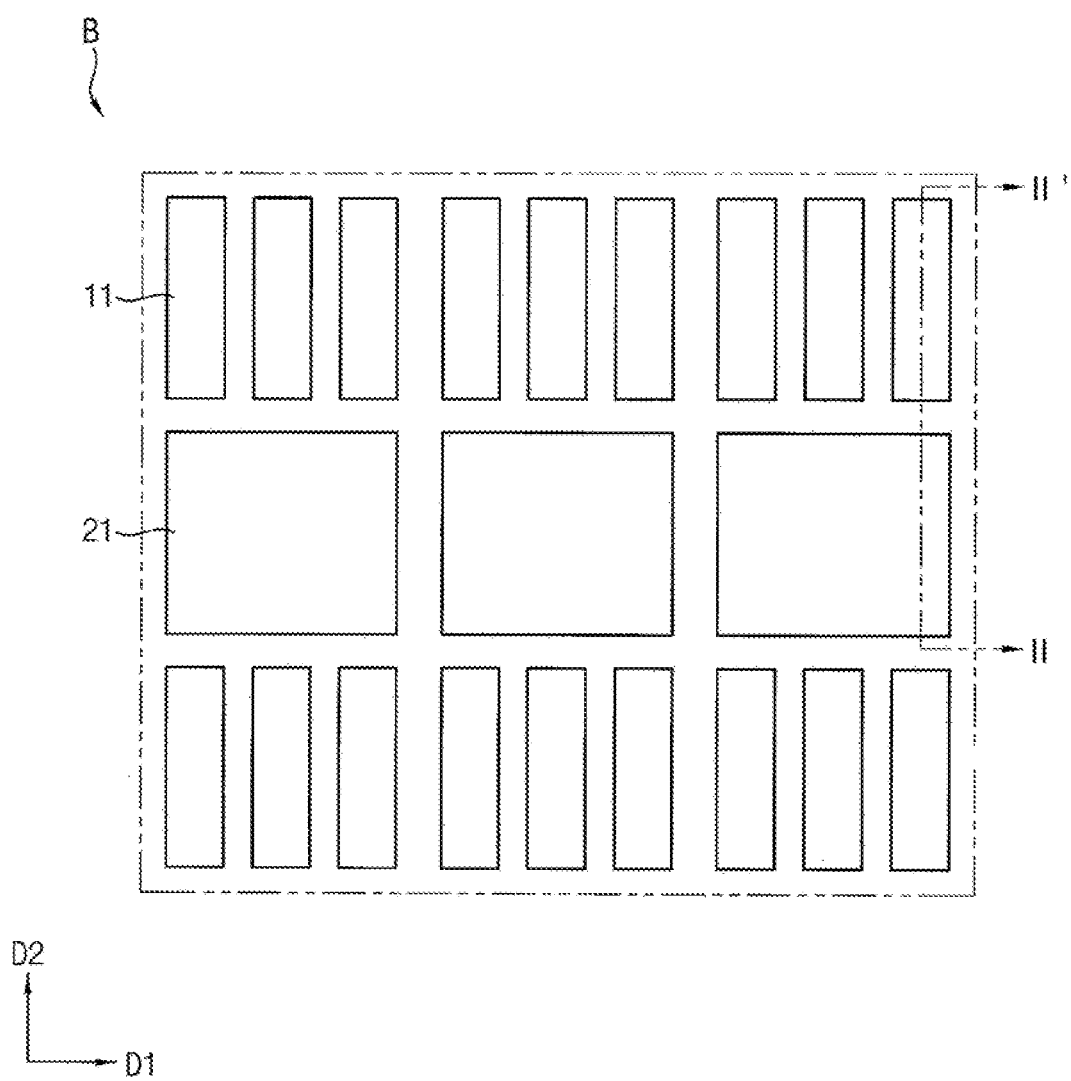
FIG. 6 is a partially enlarged plan view of a portion 'B' of a first module region of FIG. 4.
Figure 8:
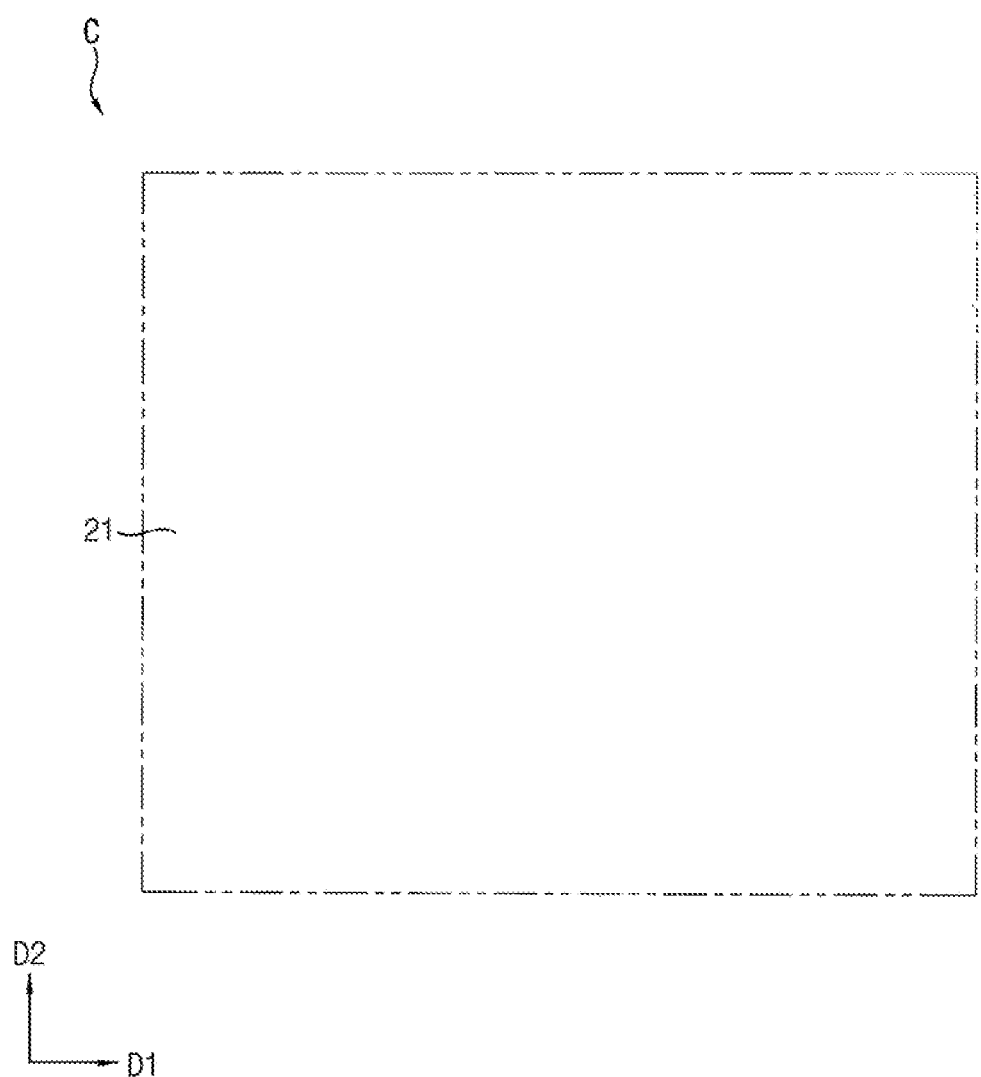
FIG. 8 is a partially enlarged plan view of a portion 'C' of a second module region of FIG. 4.

Referring again to FIGS. 1 to 4, according to an embodiment, the display region 10 includes a plurality of sub-pixel regions that correspond to sub-pixel region 11 of FIG. 5, the first module region 20 includes a plurality of sub-pixel regions and a plurality of transmissive regions that respectively correspond to sub-pixel region 11 and transmissive region 21 of FIG. 6, and the second module region 30 includes a transmissive region that corresponds to transmissive region 21 of FIG. 8. In exemplary embodiments, the OLED display device 100 displays an image in the display region 10 and the first module region 20, and does not display an image in the second module region 30.

According to an embodiment, the first functional module 410 on the second surface S2 overlaps the first module region 20 on the first surface S1 of the OLED display device 100. In other words, a size of the first module region 20 is substantially the same as a size of the first functional module 410. That is, a shape of the first module region 20 corresponds to a shape of the first functional module 410. The first functional module 410 may be a face recognition sensor module that detects a user's face, a pupil recognition sensor module that detects a user's pupil, an acceleration sensor module and a geomagnetic sensor module that detects movement of the OLED display device 100, a proximity sensor module and an infrared sensor module that detects proximity with respect to a front side of the OLED display device 100, an illumination sensor module that measures brightness when the display device is left in a pocket or a bag, etc. In exemplary embodiments, the first functional module 410 operates by using less external light than the second functional module 420. For example, when transmittance of external light incident onto the first surface S1 of the OLED display device 100 in the first module region 20 and propagating through the OLED display device 100 is approximately 35% or more, the first functional module 410 can operate.

According to an embodiment, the second functional module 420 on the second surface S2 overlaps the second module region 30 on the first surface S1 of the OLED display device 100. In other words, a size of the second module region 30 is substantially the same as a size of the second functional module 420. That is, a shape of the second module region 30 corresponds to a shape of the second functional module 420. The second functional module 420 may be a camera module that acquires or recognizes an image of an object located on the first surface S1 of the OLED display device 100. In exemplary embodiments, to acquire an object's image with high resolution, the second functional module 420 operates by using more external light than the first functional module 410.

According to an embodiment, although each of the first and second module regions 20 and 30 has been illustrated as having a circular shape when viewed from a top, shapes are not limited thereto in other embodiments. For example, each of the first and second module regions 20 and 30 may have a triangular shape, a rhombic shape, a polygonal shape, a rectangular shape, or an elliptical shape when viewed from the top.

Figure 7:
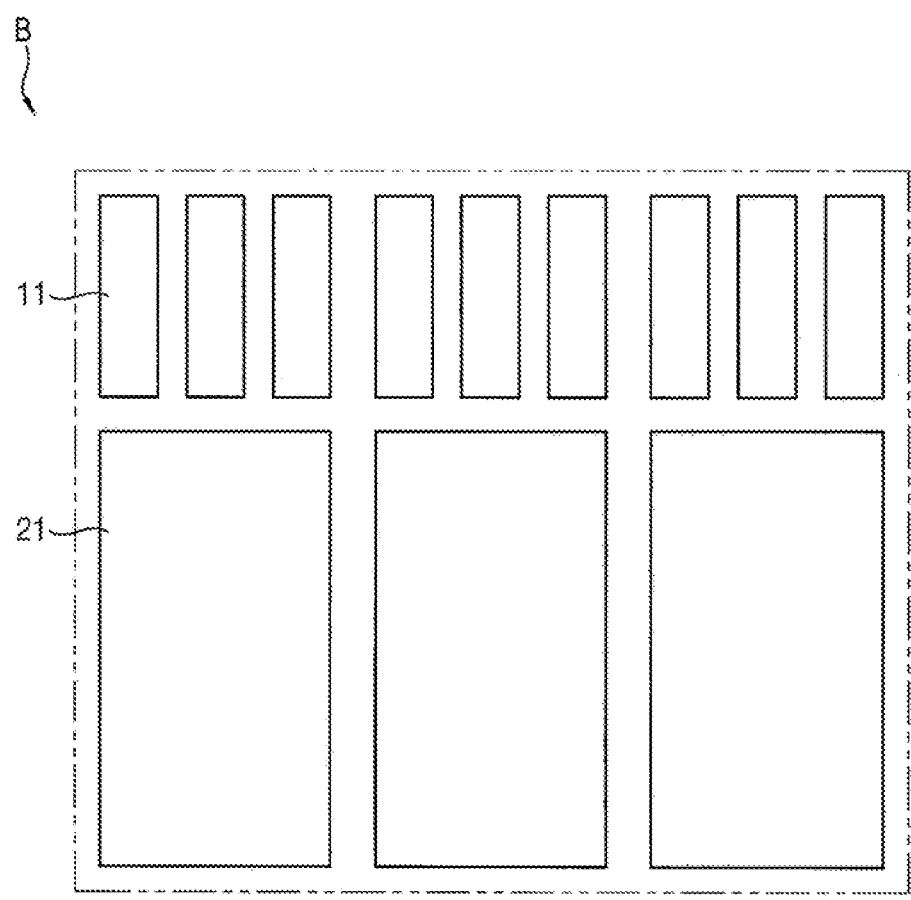
FIG. 7 is a partially enlarged plan view one of an example of a first module region of FIG. 6.

FIG. 5 is a partially enlarged plan view of a portion 'A' of a display region of FIG. 4, FIG. 6 is a partially enlarged plan view of a portion 'B' of a first module region of FIG. 4, FIG. 7 is a partially enlarged plan view of an example of a first module region of FIG. 6, and FIG. 8 is a partially enlarged plan view of a portion 'C' of a second module region of FIG. 4.

Referring to FIGS. 3, 5, 6, and 8, according to an embodiment, the OLED display device 100 includes the display region 10, the first module region 20, and the second module region 30.

As shown in FIG. 5, according to an embodiment, the display region 10 includes a plurality of sub-pixel regions 11. In the display region 10, the sub-pixel regions 11 are arranged in the first direction D1 and the second direction D2 orthogonal to the first direction D1. In other words, the sub-pixel regions 11 are arranged over the display region 10. For example, the sub-pixel regions 11 disposed in the display region 10 may be arranged in an RGB stripe scheme in which identical sized rectangles are arranged in order, an S-stripe scheme that includes a relatively large blue sub-pixel region, a WRGB scheme that further includes a white sub-pixel region, a PenTile scheme in which RG-GB patterns are repeated, etc. In exemplary embodiments, a semiconductor element 250, a sub-pixel structure 200, etc., of FIG. 9 are disposed in each of the sub-pixel regions 11 of the display region 10, and an image is displayed on the first surface S1 in the display region 10 through the semiconductor element 250 and the sub-pixel structure 200.

According to an embodiment, although each of the display region 10 and the sub-pixel regions 11 included in the display region 10 have been illustrated as having a rectangular shape when viewed from the top, shapes are not limited thereto in other embodiments. For example, each of the display region 10 and the sub-pixel regions 11 included in the display region 10 may have a triangular shape, a rhombic shape, a polygonal shape, a circular shape, or an elliptical shape when viewed from the top.

As shown in FIG. 6, according to an embodiment, the first module region 20 includes a plurality of sub-pixel regions 11 and a plurality of transmissive regions 21. In this case, external light propagates through the transmissive region 21. The sub-pixel regions 11 are spaced apart in the first direction D1 in the first module region 20, and the transmissive regions 21 are spaced apart in the first direction D1 in a different row from that of the sub-pixel regions 11. In other words, the sub-pixel regions 11 and the transmissive regions 21 are arranged in the first module region 20. For example, the sub-pixel regions 11 in the first module region 20 may be arranged in an RGB stripe scheme in which identically shaped rectangles are arranged in order, an S-stripe scheme that includes a relatively large blue sub-pixel region, a WRGB scheme that further includes a white sub-pixel region, a PenTile scheme in which RG-GB patterns are repeated, etc.

Figure 10:
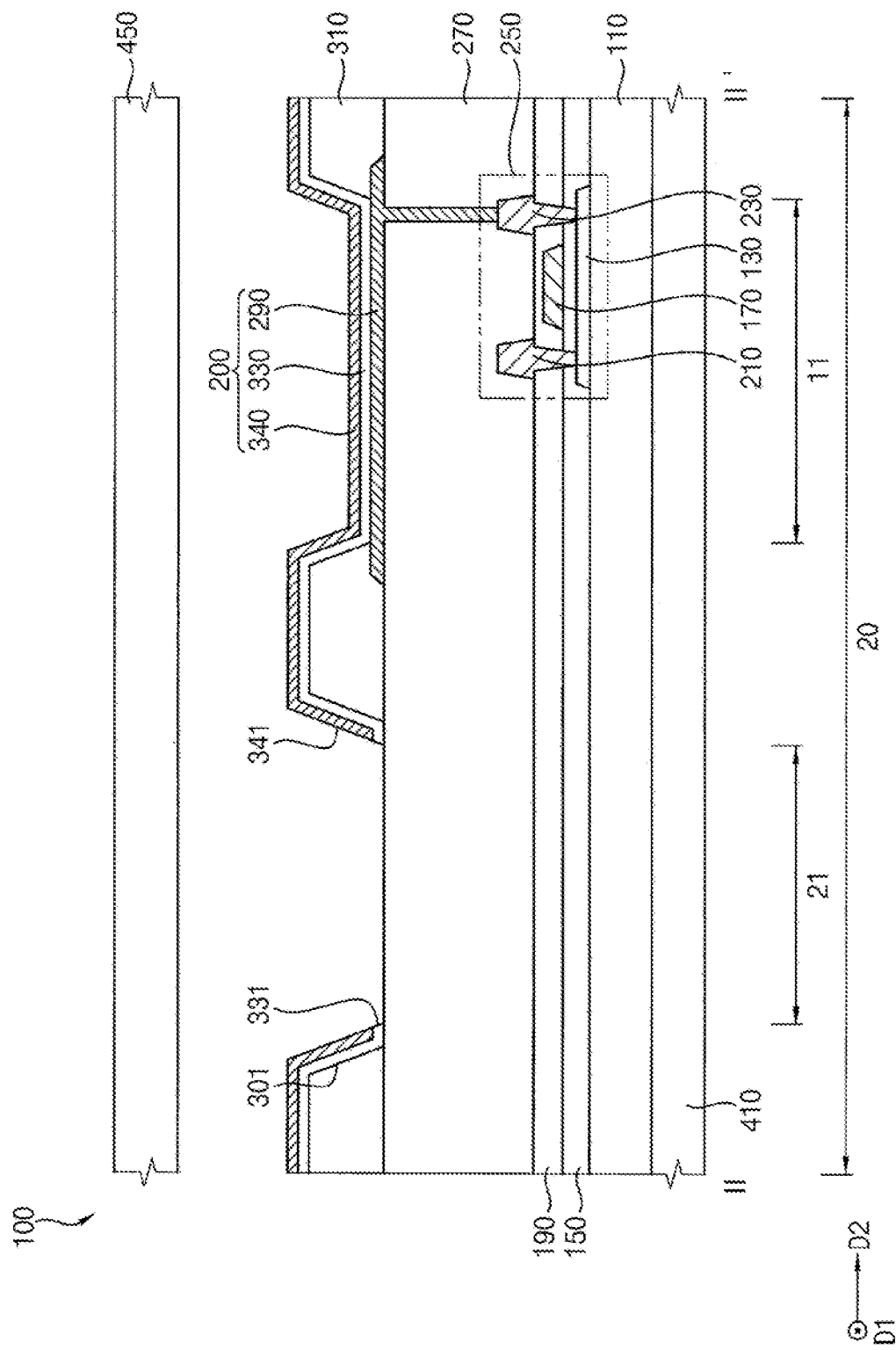
FIG. 10 is a sectional view taken along line II-II' of FIG. 6.

In exemplary embodiments, a semiconductor element 250, a sub-pixel structure 200, etc., of FIG. 10 are disposed in each of the sub-pixel regions 11 of the first module region 20, and an image is displayed on the first surface S1 in the first module region 20 through the semiconductor element 250 and the sub-pixel structure 200. In addition, light, such as external light, incident through the transmissive regions 21 in the first module region 20 can propagate through the OLED display device 100 to the first functional module 410 disposed in the first module region 20. In other words, although a size of each of the transmissive regions 21 in the first module region 20 is smaller than a size of the transmissive region 21 in the second module region 30, since the first functional module 410 can operate using less external light than the second functional module 420, the first functional module 410 can easily operate in the first module region 20, and an image can be simultaneously displayed in the first module region 20.

According to an embodiment, a size of each of the sub-pixel regions 11 in the display region 10 of FIG. 5 is substantially the same as a size of each of the sub-pixel regions 11 in the first module region 20. However, the first module region 20 includes fewer sub-pixel regions per unit area due to the transmissive regions 21. In other words, a resolution of the first module region 20 is lower than a resolution of the display region 10.

According to an embodiment, although each of the sub-pixel regions 11 in the first module region 20 has been illustrated as having a rectangular shape when viewed from the top, shapes are not limited thereto in other embodiments. For example, each of the sub-pixel regions 11 in the first module region 20 may have a triangular shape, a rhombic shape, a polygonal shape, a circular shape or an elliptical shape when viewed from the top.

In other exemplary embodiments, as shown in FIG. 7, the first module region 20 includes a relatively large transmissive region 21. In other words, the first module region 20 of FIG. 7 includes fewer sub-pixel regions per unit area due to the larger transmissive regions 21. In this case, even though the first module region 20 has relatively low resolution, a relatively large amount of external light can propagate to the first functional module 410 due to the large transmissive region 21. In other words, the transmittance of external light incident onto the first surface S1 of the OLED display device 100 in the first module region 20 and propagating through the OLED display device 100 can be adjusted by adjusting the size of each of the transmissive regions 21 in the first module region 20.

As shown in FIG. 8, according to an embodiment, the second module region 30 includes the transmissive region 21. In this case, a size of the transmissive region 21 in the second module region 30 of FIG. 8 is greater than the size of each of the transmissive regions 21 in the first module region 20 of FIG. 6. In other words, a size of the transmissive region 21 in the second module region 30 is substantially the same as the size of the second module region 30. In addition, external light can propagate through the transmissive region 21 in the second module region 30.

Figure 11:
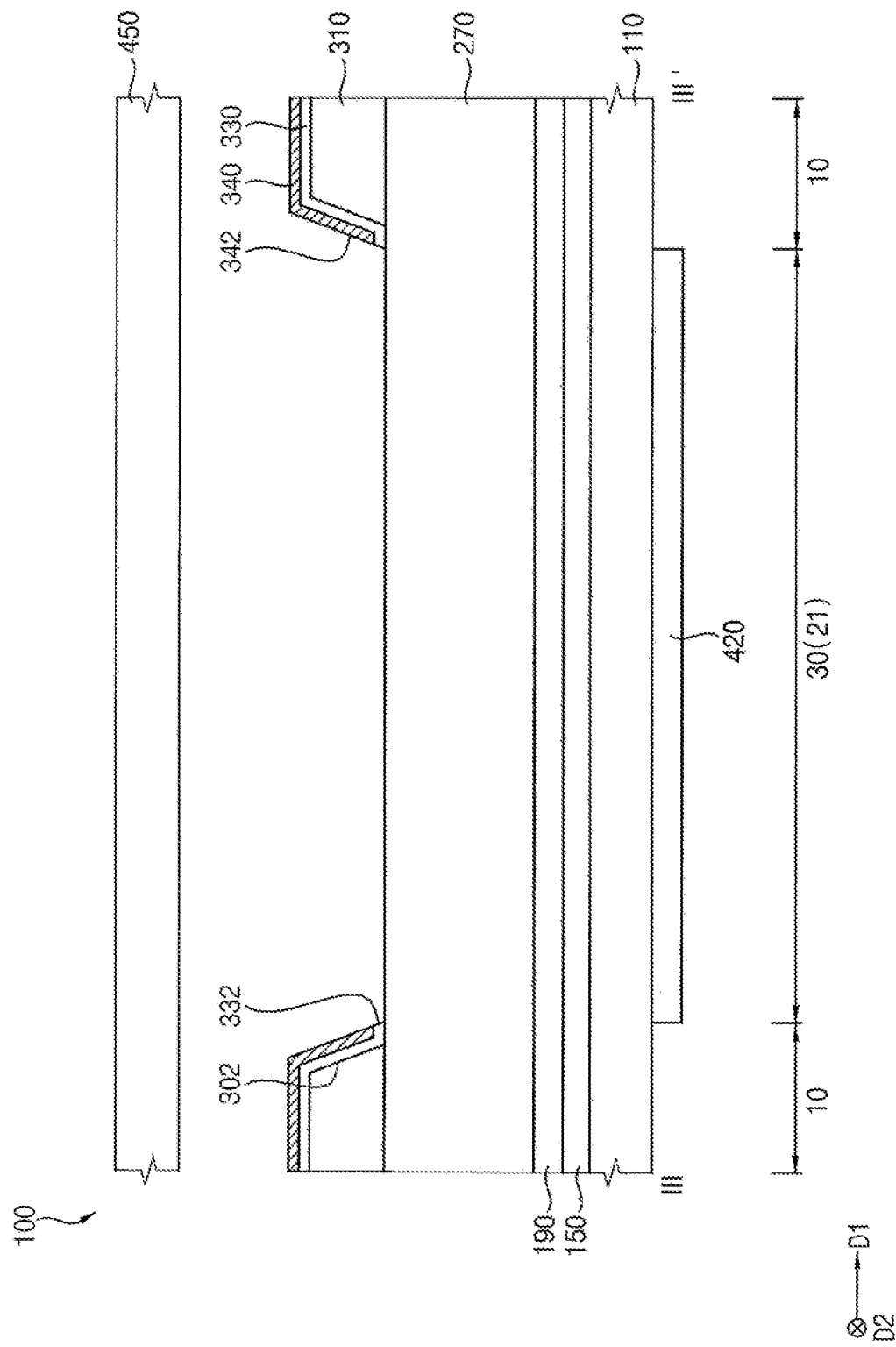
FIG. 11 is a sectional view taken along line III-III' of FIG. 4.

In exemplary embodiments, as shown in FIG. 11, no semiconductor element or sub-pixel structure is disposed in the transmissive region 21 in the second module region 30. In other words, since no semiconductor element or sub-pixel structure is disposed in the second module region 30, no image can be displayed in the second module region 30. In addition, external light can propagate through the transmissive region 21 in the second module region 30 and through the OLED display device 100 to be provided to the second functional module 420 in the second module region 30. Moreover, the second functional module 420 in the second module region 30 on the second surface S2 of the OLED display device 100 can acquire an image of an object located on the first surface S1 of the OLED display device 100 through the transmissive region 21 in the second module region 30. In other words, since the size of the transmissive region 21 in the second module region 30 is larger than the size of each of the transmissive regions 21 included in the first module region 20, a large amount of external light can propagate to the second functional module 420, and the second functional module 420 can easily recognize an image of an object located on the first surface S1 of the OLED display device 100.

According to an embodiment, although the transmissive region 21 in the second module region 30 has been illustrated as having a circular shape when viewed from the top, the shape is not limited thereto in other embodiments. For example, the transmissive region 21 in the second module region 30 may have a triangular shape, a rhombic shape, a polygonal shape, a rectangular shape, or an elliptical shape when viewed from the top.

Figure 9:
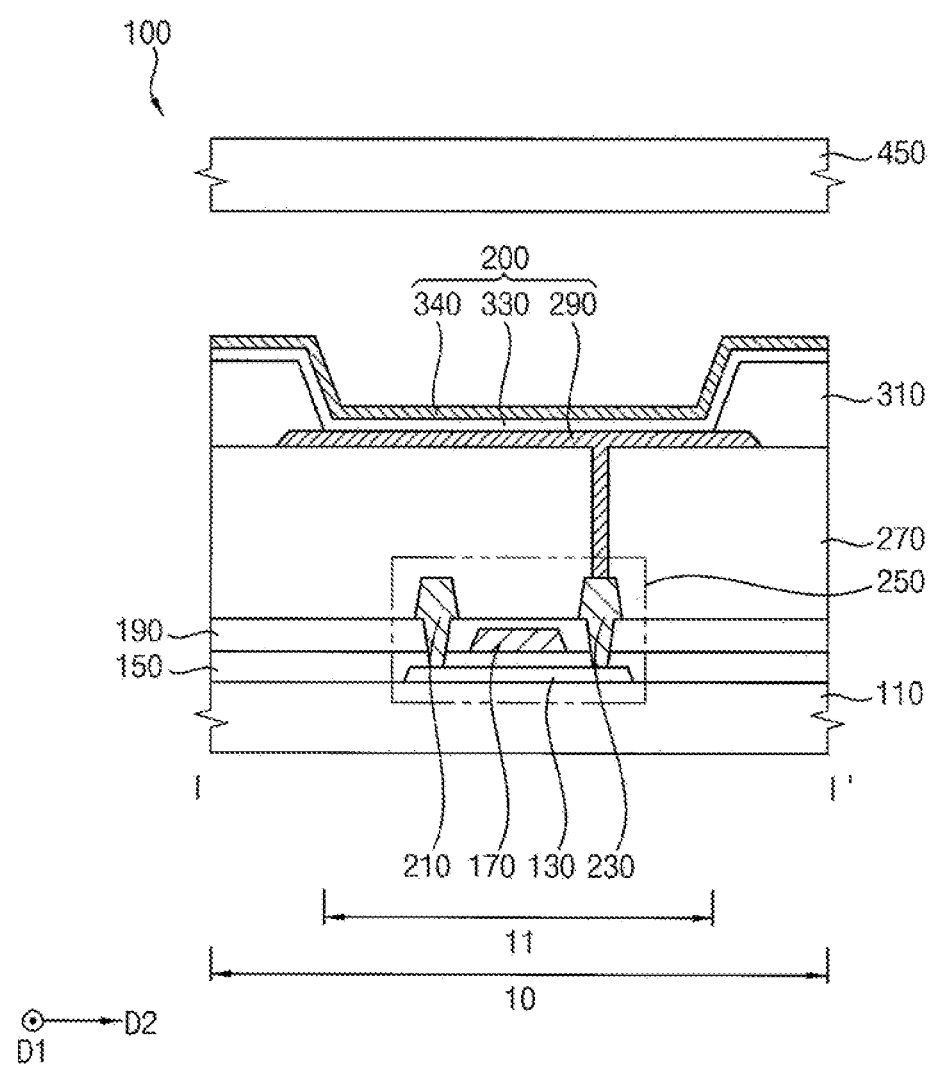
FIG. 9 is a sectional view taken along line I-I' of FIG. 5.

FIG. 9 is a sectional view taken along line I-I' of FIG. 5, FIG. 10 is a sectional view taken along line II-II' of FIG. 6, and FIG. 11 is a sectional view taken along line III-III' of FIG. 4.

Referring to FIGS. 9, 10, and 11, according to an embodiment, the OLED display device 100 includes a lower substrate 110, semiconductor elements 250, a gate insulating layer 150, an insulating interlayer 190, a planarization layer 270, a pixel defining layer 310, sub-pixel structures 200, an upper substrate 450, a first functional module 410, a second functional module 420, etc. In this case, each of the semiconductor elements 250 includes an active layer 130, a gate electrode 170, a source electrode 210, and a drain electrode 230, and each of the sub-pixel structures 200 includes a lower electrode 290, a light emitting layer 330, and an upper electrode 340.

According to an embodiment, although the semiconductor element 250 and the sub-pixel structure 200 of FIG. 9 and the semiconductor element 250 and the sub-pixel structure 200 of FIG. 10 are assumed to have the same reference numeral for convenience of explanation, the semiconductor element 250 and the sub-pixel structure 200 of FIG. 9 and the semiconductor element 250 and the sub-pixel structure 200 of FIG. 10 have semiconductor elements and sub-pixel structures that differ from each other. In other words, the semiconductor element 250 and the sub-pixel structure 200 of FIG. 9 are disposed in each of the sub-pixel regions 11 in the display region 10, and the semiconductor element 250 and the sub-pixel structure 200 of FIG. 10 are disposed in each of the sub-pixel regions 11 in the first module region 20.

According to an embodiment, since the OLED display device 100 includes the display region 10 that includes sub-pixel regions 11, the first module region 20 includes sub-pixel regions 11 and transmissive regions 21, and the second module region 30 includes transmissive region 21, the lower substrate 110 is also divided into the display region 10 that includes the sub-pixel regions 11, the first module region 20 that includes the sub-pixel regions 11 and the transmissive regions 21, and the second module region 30 that includes the transmissive region 21.

According to an embodiment, the lower substrate 110 includes a transparent or opaque material. The lower substrate 110 may be one of a quartz substrate, a synthetic quartz substrate, a calcium fluoride substrate, a fluorine-doped quartz substrate (F-doped quartz substrate), a soda lime glass substrate, a non-alkali glass substrate, etc.

Alternatively, according to other embodiments, the lower substrate 110 can be formed using a flexible transparent resin substrate. An example of a transparent resin substrate that can be used as the lower substrate 110 is a polyimide substrate. In this case, the polyimide substrate includes a first polyimide layer, a barrier film layer, a second polyimide layer, etc. For example, the polyimide substrate has a structure in which a first polyimide layer, a barrier film layer, and a second polyimide layer are sequentially laminated on a rigid glass substrate. In this case, in a method of manufacturing an organic light emitting diode display device, after an insulating layer is disposed on the second polyimide layer of the polyimide substrate, an upper structure, such as semiconductor elements 250, sub-pixel structures 200, etc., is disposed on the insulating layer. After the upper structure is formed, the rigid glass substrate is removed. In other words, since the polyimide substrate is thin and flexible, it is challenging to directly form the upper structure on the polyimide substrate. In this regard, the rigid glass substrate is removed after the upper structure is formed, so that the polyimide substrate can be used as the lower substrate 110.

According to an embodiment, a buffer layer is disposed on the lower substrate 110. The buffer layer is disposed over the lower substrate 110. The buffer layer can prevent metal atoms or impurities from diffusing from the lower substrate 110 into the upper structure, and can control a heat transfer rate during a crystallization process that forms the active layer 130 to obtain a substantially uniform active layer 130. In addition, the buffer layer can improve a flatness of a surface of the lower substrate 110 when the surface of the lower substrate 110 is not uniform. Depending on a type of the lower substrate 110, at least two buffer layers can be provided on the lower substrate 110, or the buffer layer is omitted from the lower substrate 110. In addition, the buffer layer may include an organic material or an inorganic material.

According to an embodiment, active layers 130 are disposed in the sub-pixel regions 11 in the display region 10 and the sub-pixel regions 11 in the first module region 20 on the lower substrate 110. In other words, the active layer 130 is omitted from the second module region 30. The active layers 130 may include one or more of an oxide semiconductor, an inorganic semiconductor, such as amorphous silicon or a poly silicon semiconductor, an organic semiconductor, etc. Each of the active layers 130 has a channel region, a source region, and a drain region.

According to an embodiment, the gate insulating layer 150 is disposed in the display region 10, the first module region 20, and the second module region 30 on the active layers 130 and the lower substrate 110. In exemplary embodiments, the gate insulating layer 150 is disposed over the lower substrate 110. For example, in some embodiments, the gate insulating layer 150 covers the active layers 130 on the lower substrate 110, and has a substantially flat top surface without creating a step around the active layers 130. Alternatively, in other embodiments, the gate insulating layer 150 covers the active layers 130 on the lower substrate 110 with a uniform thickness. The gate insulating layer 150 may include one or more of a silicon compound, a metal oxide, etc. For example, the gate insulating layer 150 may include one or more of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In other exemplary embodiments, the gate insulating layer 150 has a multilayer structure that includes a plurality of insulating layers formed of different materials.

According to an embodiment, gate electrodes 170 are disposed on the gate insulating layer 150 in the sub-pixel regions 11 in the display region 10 and the sub-pixel regions 11 in the first module region 20. In other words, the gate electrodes 170 are omitted from the second module region 30. For example, each of the gate electrodes 170 is disposed on a portion of the gate insulating layer 150 under which each of the active layers 130 is located, to overlap a channel region of active layer 130. Each of the gate electrodes 170 may include one or more of a metal, an alloy, a metal nitride, a conductive metal oxide, a transparent conductive material, etc. For example, in some embodiments, each of the gate electrodes 170 may include one or more of gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), a gold-containing alloy, a silver-containing alloy, an aluminum-containing alloy, a platinum-containing alloy, a chromium-containing alloy, a copper-containing alloy, a molybdenum-containing alloy, aluminum nitride ($AlN_x$), titanium nitride ($TiN_x$), chromium nitride ($CrN_x$), tantalum nitride ($TaN_x$), tungsten nitride ($WN_x$), strontium ruthenium oxide ($SrRu_xO_y$), zinc oxide ($ZnO_x$), tin oxide ($SnO_x$), indium oxide ($InO_x$), gallium oxide ($GaO_x$), indium tin oxide (ITO), indium zinc oxide (IZO), etc. These may be used alone or in combination with each other. Alternatively, in other embodiments, each of the gate electrodes 170 has a multilayer structure that includes a plurality of layers.

According to an embodiment, the insulating interlayer 190 is disposed on the gate electrodes 170 and the gate insulating layer 150 in the display region 10, the first module region 20, and the second module region 30. In exemplary embodiments, the insulating interlayer 190 is disposed over the gate insulating layer 150. For example, in some embodiments, the insulating interlayer 190 covers the gate electrodes 170 on the gate insulating layer 150, and has a substantially flat top surface without creating a step around the gate electrodes 170. Alternatively, in other embodiments, the insulating interlayer 190 covers the gate electrodes 170 on the gate insulating layer 150 with a uniform thickness.

The insulating interlayer 190 may include a silicon compound, a metal oxide, etc. In other exemplary embodiments, the insulating interlayer 190 has a multilayer structure that includes a plurality of insulating layers formed of different materials.

According to an embodiment, source electrodes 210 and drain electrodes 230 are disposed on the insulating interlayer 190 in the sub-pixel regions 11 in the display region 10 and the sub-pixel regions 11 in the first module region 20. Each of the source electrodes 210 is connected to a source region of each of the active layers 130 through a contact hole formed by removing first portions of the gate insulating layer 150 and the insulating interlayer 190, and each of the drain electrodes 230 is connected to a drain region of each of the active layers 130 through a contact hole formed by removing second portions of the gate insulating layer 150 and the insulating interlayer 190. In some embodiments, each of the source electrodes 210 and the drain electrodes 230 may include one or more of a metal, an alloy, a metal nitride, a conductive metal oxide, a transparent conductive material, etc. These may be used alone or in combination with each other. Alternatively, in other embodiments, each of the source electrodes 210 and drain electrodes 230 has a multilayer structure that includes a plurality of layers.

Accordingly, according to an embodiment, the semiconductor element 250 that includes the active layer 130, the gate electrode 170, the source electrode 210, and the drain electrode 230 is disposed in each of the sub-pixel regions 11 in the display region 10, and the semiconductor element 250 that includes the active layer 130, the gate electrode 170, the source electrode 210, and the drain electrode 230 is disposed in each of the sub-pixel regions 11 in the first module region 20.

According to an embodiment, although each of the semiconductor elements 250 has been described as having a top gate structure, embodiments of the present disclosure are not limited thereto. For example, in other embodiments, each of the semiconductor elements 250 may have a bottom gate structure, a double gate structure, etc.

In addition, according to an embodiment, although the OLED display device 100 has been described as including one semiconductor element in each of the sub-pixel regions 11 in the display region 10 and the first module region 20, embodiments of the present disclosure are not limited thereto. For example, in other embodiments, the OLED display device 100 may include at least one semiconductor element, at least one storage capacitor, etc., in each of the sub-pixel regions 11 in the display region 10 and the first module region 20.

According to an embodiment, the planarization layer 270 is disposed on the insulating interlayer 190 and the semiconductor elements 250 in the display region 10, the first module region 20, and the second module region 30, and the planarization layer 270 includes contact holes that expose a part of the drain electrode 230 in each of the sub-pixel regions 11 in the display region 10, and a part of the drain electrode 230 in each of the sub-pixel regions 11 in the first module region 20. In exemplary embodiments, the planarization layer 270 is disposed over the insulating interlayer 190. The planarization layer 270 is sufficiently thick to cover the semiconductor elements 250, and in this case, the planarization layer 270 has a substantially flat top surface. To implement such a flat top surface of the planarization layer 270, a planarization process is additionally performed on the planarization layer 270. The planarization layer 270 may include an organic material or an inorganic material. In exemplary embodiments, the planarization layer 270 includes an organic material. For example, the planarization layer 270 may include one of a photoresist, a polyacrylic resin, a polyimide-based resin, a polyamide-based resin, a siloxane-based resin, an acrylic resin, an epoxy-based resin, etc.

According to an embodiment, lower electrodes 290 are disposed on the planarization layer 270 in the sub-pixel regions 11 in the display region 10 and the sub-pixel regions 11 in the first module region 20. The lower electrode 290 in each of the sub-pixel regions 11 in the display region 10 makes direct contact with the drain electrode 230 in each of the sub-pixel regions 11 in the display region 10 through the contact hole of the planarization layer 270, and the lower electrode 290 in each of the sub-pixel regions 11 in the display region 10 is electrically connected to the semiconductor element 250 in each of the sub-pixel regions 11 in the display region 10. In addition, the lower electrode 290 in each of the sub-pixel regions 11 in the first module region 20 makes direct contact with the drain electrode 230 in each of the sub-pixel regions 11 in the first module region 20 through the contact hole, and the lower electrode 290 in each of the sub-pixel regions 11 in the first module region 20 is electrically connected to the semiconductor element 250 in each of the sub-pixel regions 11 in the first module region 20. Each of the lower electrodes 290 may include one or more of a metal, an alloy, a metal nitride, a conductive metal oxide, a transparent conductive material, etc. These may be used alone or in combination with each other. In other exemplary embodiments, each of the lower electrodes 290 has a multilayer structure that includes a plurality of layers.

According to an embodiment, the pixel defining layer 310 is disposed on the planarization layer 270 in the display region 10 and the first module region 20. In other words, the pixel defining layer 310 is omitted from the second module region 30. The pixel defining layer 310 covers both sides of each of the lower electrodes 290, and has an opening that exposes a part of a top surface of each of the lower electrodes 290. In exemplary embodiments, the pixel defining layer 310 has an opening 301 in the first module region 20 that exposes a top surface of the planarization layer 270 in the transmissive regions 21 in the first module region 20 or in the first module region 20 adjacent to each of the transmissive regions 21, and the pixel defining layer 310 has an opening 302 in the display region 10 that exposes the top surface of the planarization layer 270 in the second module region 30. The pixel defining layer 310 may be formed of an organic material or an inorganic material. In exemplary embodiments, the pixel defining layer 310 includes an organic material. Alternatively, in other embodiments, the pixel defining layer 310 is disposed in the transmissive region 21 in the second module region 30. In this case, the pixel defining layer 310 includes a transparent material.

According to an embodiment, the light emitting layer 330 is disposed on the pixel defining layer 310, the lower electrode 290, and a part of the planarization layer 270 in the display region 10 and a part of the first module region 20, and is omitted from the second module region 30. In exemplary embodiments, the light emitting layer 330 is disposed in the display region 10 over the pixel defining layer 310 and the lower electrode 290. In addition, in the first module region 20, the light emitting layer 330 is disposed on the pixel defining layer 310 and the lower electrode 290 in each of the sub-pixel regions 11 without being disposed in the transmissive region 21. In other words, the light emitting layer 330 has a first opening 331 that exposes the top surface of the planarization layer 270 in each of the transmissive regions 21 in the first module region 20. Moreover, the light emitting layer 330 has a third opening 332 that exposes the top surface of the planarization layer 270 in the transmissive region 21 in the second module region 30. Accordingly, the light emitting layer 330 has first openings 331 formed in the first module region 20 and the third opening 332 formed in the second module region 30, so that external light incident thereon can propagate through the transmissive regions 21 in the first module region 20 and the second module region 30.

According to an embodiment, the light emitting layer 330 has a multilayer structure that includes an organic light emission layer (EML), a hole injection layer (HIL), a hole transport layer (HTL), an electron transport layer (ETL), an electron injection layer (EIL), etc. In exemplary embodiments, the organic light emission layer (EML), the hole injection layer (HIL), the hole transport layer (HTL), the electron transport layer (ETL), and the electron injection layer (EIL) are disposed on the entire pixel defining layer 310 in the sub-pixel regions 11 in the display region 10 and the first module region 20. In other exemplary embodiments, the organic light emission layer (EML) is disposed only in the sub-pixel regions 11 in the display region 10 and the first module region 20, and the hole injection layer (HIL), the hole transport layer (HTL), the electron transport layer (ETL), and the electron injection layer (EIL), but not the organic light emission layer (EML), are disposed on the pixel defining layer 310 in the display region 10 and the first module region 20.

According to an embodiment, the organic light emission layer (EML) of the light emitting layer 330 is formed using at least one light emitting material that emits different colors, i.e., red light, green light, blue light, etc., according to sub-pixels. Alternatively, in other embodiments, the organic light emission layer (EML) of the light emitting layer 330 is formed by laminating a plurality of light emitting materials that emit different colors, such as red light, green light, and blue light, to emit white light as a whole. In this case, a color filter is disposed on the light emitting layer 330. The color filter includes at least one of a red filter, a green filter, or a blue filter. Alternatively, the color filter may include a yellow filter, a cyan filter, or a color filter. The color filter may be a photosensitive resin, a color photoresist, etc.

According to an embodiment, the upper electrode 340 is disposed on the light emitting layer 330 in the display region 10 and a part of the first module region 20, and is omitted from the second module region 30. In exemplary embodiments, the upper electrode 340 is disposed over the light emitting layer 330 in the display region 10. In addition, the upper electrode 340 overlaps the light emitting layer 330 in the first module region 20. In other words, the upper electrode 340 has a second opening 341 that overlaps the first opening 331 that exposes the top surface of the planarization layer 270 in each transmissive region 21 in the first module region 20. Moreover, the upper electrode 340 has a fourth opening 342 that overlaps the third opening 332 that exposes the top surface of the planarization layer 270 in the transmissive region 21 in the second module region 30. Accordingly, the upper electrode 340 has second openings 341 formed in the first module region 20 and the fourth opening 342 formed in the second module region 30, so that the external light incident thereon can propagate through the transmissive regions 21 in the first module region 20 and the second module region 30.

In exemplary embodiments, locations of the first opening 331 and the second opening 341 respectively correspond to each of the transmissive regions 21 in the first module region 20, and locations of the third opening 332 and the fourth opening 342 correspond to the transmissive region 21 in the second module region 30.

According to an embodiment, the upper electrode 340 may include one or more of a metal, an alloy, a metal nitride, a conductive metal oxide, a transparent conductive material, etc. These may be used alone or in combination with each other. Alternatively, in other embodiments, the upper electrode 340 has a multilayer structure that includes a plurality of layers.

Accordingly, according to an embodiment, the sub-pixel structure 200 that includes the lower electrode 290, the light emitting layer 330, and the upper electrode 340 is disposed in each of the sub-pixel regions 11 in the display region 10, and in each of the sub-pixel regions 11 in the first module region 20. In this case, the light emitting layer 330 in the display region 10 and the light emitting layer 330 in the first module region 20 can be formed integrally with each other, and the upper electrode 340 in the display region 10 and the upper electrode 340 in the first module region 20 can be formed integrally with each other.

In other exemplary embodiments, the OLED display device 100 further includes a capping layer, and the capping layer is disposed on the upper electrode 340 in the display region 10 and a part of the first module region 20, and is omitted from the second module region 30. The capping layer is disposed over the upper electrode 340 in the display region 10, and overlaps the upper electrode 340 in the first module region 20. In addition, the capping layer has openings that overlap the first opening 331 and the second opening 341 that expose the top surface of the planarization layer 270 in each of the transmissive regions 21 in the first module region 20. Moreover, the capping layer has an opening that exposes the top surface of the planarization layer 270 in the transmissive region 21 in the second module region 30. The capping layer protects the sub-pixel structure 200, and may include an organic material or an inorganic material. In exemplary embodiments, the capping layer includes an organic material such as a triamine derivative, an arylenediamine derivative, 4,4'-N,N'-dicarbazole-biphenyl (4,4'-bis(N-carbazolyl)-1,1'-biphenyl)(CBP), or tris-8-hydroxyquinoline aluminum (Alq3).

According to an embodiment, the upper substrate 450 is disposed on the upper electrode 340, and the upper substrate 450 faces the lower substrate 110. The upper substrate 450 includes a material substantially the same as the material of the lower substrate 110. For example, the upper substrate 450 may be one of a quartz substrate, a synthetic quartz substrate, a calcium fluoride substrate, a fluorine-doped quartz substrate (F-doped quartz substrate), a soda lime glass substrate, a non-alkali glass substrate, etc. In other exemplary embodiments, the upper substrate 450 includes a transparent inorganic material or a flexible plastic. For example, the upper substrate 450 includes a flexible transparent resin substrate. In this case, to improve flexibility of the OLED display device 100, a structure is provided in which at least one inorganic layer and at least one organic layer are alternately laminated. The laminated structure includes a first inorganic layer, an organic layer, and a second inorganic layer. For example, a flexible first inorganic layer is disposed along a profile of the upper electrode 340, a flexible organic layer is disposed on the first inorganic layer, and a flexible second inorganic layer is disposed on the organic layer. In other words, the laminated structure corresponds to a thin film encapsulation structure that makes direct contact with the upper electrode 340.

According to an embodiment, the first functional module 410 overlaps the first module region 20 on the bottom surface, i.e., the second surface S2 of OLED display device 100, of the lower substrate 110. The first functional module 410 can detect a surrounding environment or the image of an object on the first surface S1 of the OLED display device 100 through the transmissive regions 21 in the first module region 20. In exemplary embodiments, the first functional module 410 may be a face recognition sensor module, a pupil recognition sensor module, an acceleration sensor module, a geomagnetic sensor module, a proximity sensor module, an infrared sensor module, etc.

According to an embodiment, the second functional module 420 overlaps the second module region 30 on the bottom surface of the lower substrate 110. The second functional module 420 can acquire the image of an object on the first surface S1 of the OLED display device 100 through the transmissive region 21 in the second module region 30. In exemplary embodiments, the second functional module 420 may be a camera module.

Accordingly, according to an embodiment, the OLED display device 100 is formed that includes the lower substrate 110, the semiconductor elements 250, the gate insulating layer 150, the insulating interlayer 190, the planarization layer 270, the pixel defining layer 310, the sub-pixel structures 200, the upper substrate 450, the first functional module 410, and the second functional module 420.

Since the OLED display device 100 according to exemplary embodiments includes the first module region 20 that includes the sub-pixel regions 11 and the transmissive regions 21 and the second module region 30 that includes the transmissive region 21, the first functional module 410 and the second functional module 420 can be included in the OLED display device 100 without forming an opening in the OLED display device 100.

In addition, according to an embodiment, since the sub-pixel regions 11 are included in the first module region 20, an image can be displayed in the first module region 20. Moreover, since the light emitting layer 330 and the upper electrode 340 are not disposed in the transmissive regions 21 in the first module region 20 and the second module region 30, external light can easily propagate to the first functional module 410 and the second functional module 420. Accordingly, the first functional module 410 and the second functional module 420 can detect the surrounding environment of the first surface S1 of the OLED display device 100 or may acquire an image of an object.

Figure 12:
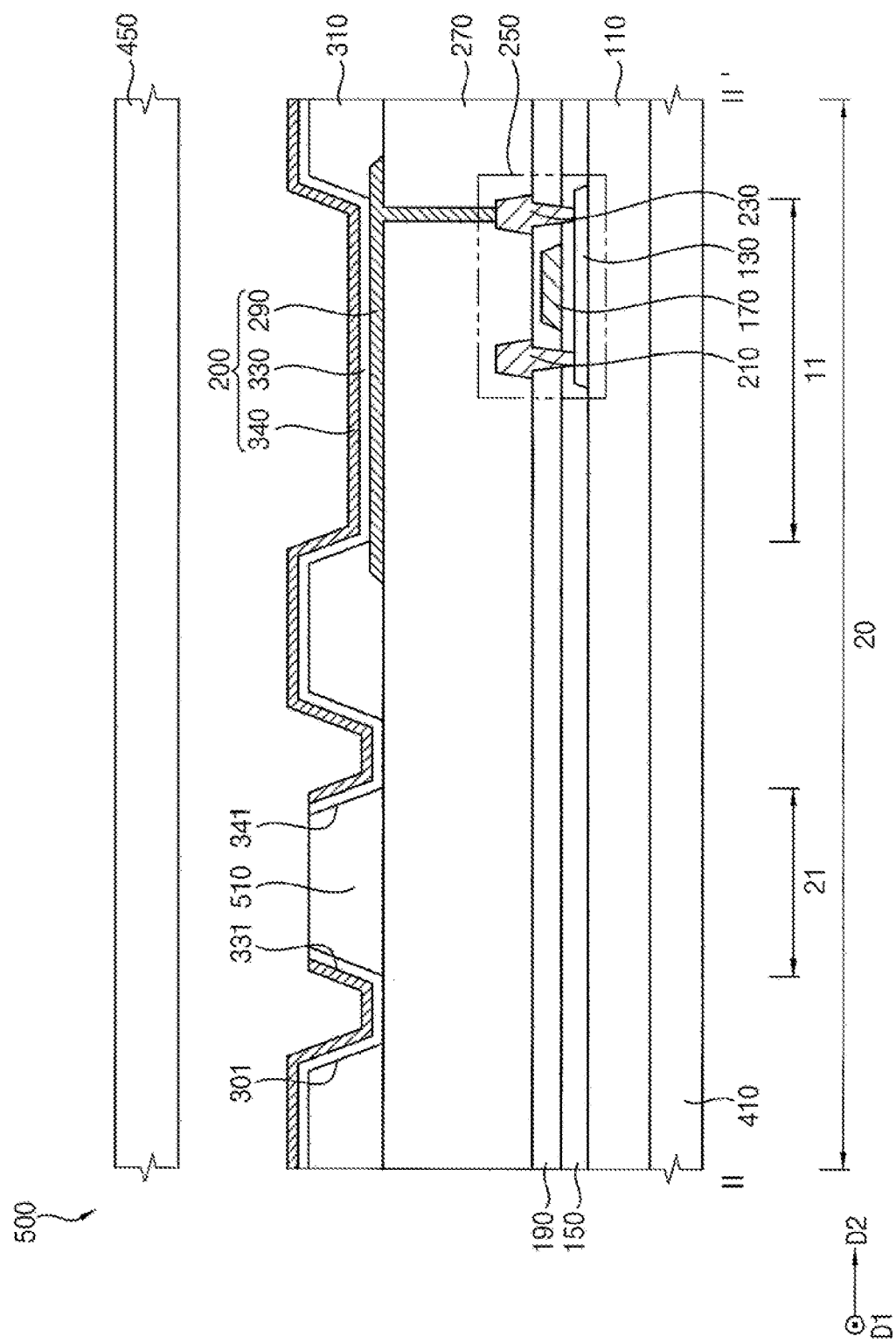
FIGS. 12 and 13 are sectional views of an OLED display device according to exemplary embodiments of the present disclosure.
Figure 13:
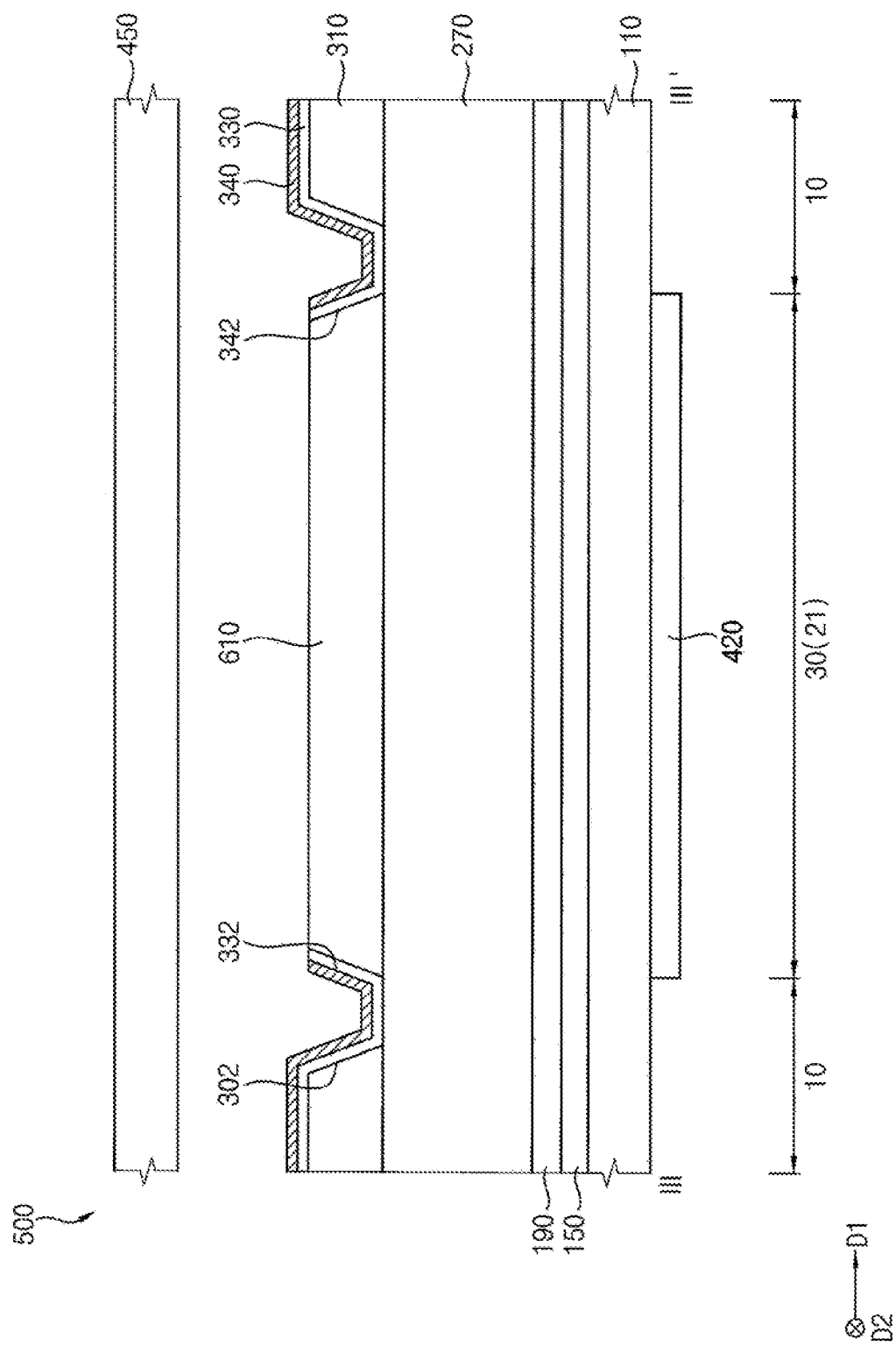

FIGS. 12 and 13 are sectional views of an OLED display device according to exemplary embodiments of the present disclosure. For example, FIG. 12 is a sectional view taken along line II-II' of FIG. 6, and FIG. 13 is a sectional view taken along line III-II' of FIG. 4. An organic light emitting diode display device 500 illustrated in FIGS. 12 and 13 has a configuration substantially identical or similar to the OLED display device 100 described with reference to FIGS. 1 to 11 except for a lower spacer 510 and a lower structure 610. In FIGS. 12 and 13, redundant descriptions for elements substantially identical or similar to the elements described with reference to FIGS. 1 to 11 will be omitted.

Referring to FIGS. 9, 12, and 13, according to an embodiment, the OLED display device 500 includes a lower substrate 110, semiconductor elements 250, a gate insulating layer 150, an insulating interlayer 190, a planarization layer 270, a pixel defining layer 310, lower spacers 510, a lower structure 610, sub-pixel structures 200, an upper substrate 450, a first functional module 410, a second functional module 420, etc. In this case, each of the sub-pixel structures 200 includes a lower electrode 290, a light emitting layer 330, and an upper electrode 340.

According to an embodiment, the pixel defining layer 310 is disposed on the planarization layer 270 in a display region 10 and a first module region 20. In other words, the pixel defining layer 310 is omitted from a second module region 30. For example, the pixel defining layer 310 covers both sides of each of lower electrodes 290, and has an opening that exposes a part of a top surface of each of the lower electrodes 290. In exemplary embodiments, the pixel defining layer 310 has an opening 301 in the first module region 20 that exposes a top surface of the planarization layer 270 in transmissive regions 21 in the first module region 20 or in the first module region 20 adjacent to each of the transmissive regions 21, and the pixel defining layer 310 has an opening 302 in the display region 10 that exposes the top surface of the planarization layer 270 in the second module region 30. The pixel defining layer 310 is formed of an organic material.

According to an embodiment, the lower spacers 510 are disposed in the first module region 20 on the planarization layer 270. For example, each of the lower spacers 510 is disposed in the opening 301 of the pixel defining layer 310 in the first module region 20, and are spaced apart from the pixel defining layer 310. In exemplary embodiments, a top surface of each of the lower spacers 510 is located at the same level as a top surface of the pixel defining layer 310. Each of the lower spacers 510 includes an organic material. For example, each of the lower spacers 510 may be one of a photoresist, a polyacrylic resin, a polyimide-based resin, a polyamide-based resin, a siloxane-based resin, an acrylic resin, an epoxy-based resin, etc.

According to an embodiment, the lower structure 610 is disposed on the planarization layer 270 in the second module region 30. For example, the lower structure 610 is disposed in the opening 302 of the pixel defining layer 310 in the second module region 30, and is spaced apart from the pixel defining layer 310. In exemplary embodiments, a top surface of the lower structure 610 is located at the same level as the top surface of the pixel defining layer 310 and the top surface of the lower spacer 510. The lower structure 610 includes an organic material.

According to an embodiment, the light emitting layer 330 is disposed on the pixel defining layer 310, the lower electrode 290, a part of the lower spacer 510, a part of the lower structure 610, and a part of the planarization layer 270 in the display region 10 and a part of the first module region 20 but is omitted from the second module region 30. In exemplary embodiments, the light emitting layer 330 is disposed over the pixel defining layer 310 and the lower electrode 290 in the display region 10. In addition, the light emitting layer 330 is disposed on the lower electrode 290 in each of the sub-pixel regions 11 and the pixel defining layer 310 in the first module region 20 but not in the transmissive region 21. In other words, the light emitting layer 330 has a first opening 331 that exposes the top surface of the lower spacer 510 in each transmissive region 21 in the first module region 20. In this case, the light emitting layer 330 is disposed on at least a part of a side surface of the lower spacer 510. Moreover, the light emitting layer 330 has a third opening 332 that exposes the top surface of the lower structure 610 in the transmissive region 21 in the second module region 30. In this case, the light emitting layer 330 is disposed on at least a part of the side surface of the lower structure 610. Accordingly, the light emitting layer 330 has first openings 331 in the first module region 20 and the third opening 332 in the second module region 30, so that external light incident thereon can easily propagate through the transmissive regions 21 in the first module region 20 and the second module region 30.

According to an embodiment, an organic light emission layer (EML) of the light emitting layer 330 is formed by using at least one light emitting material that emits different colors, according to sub-pixels. Alternatively, in other embodiments, the organic light emission layer (EML) of the light emitting layer 330 is formed by laminating a plurality of light emitting materials that emit different colors, such as red light, green light, and blue light, to emit white light as a whole.

According to an embodiment, the upper electrode 340 on the light emitting layer 330 is disposed in the display region 10 and a part of the first module region 20, and is omitted from the second module region 30. In exemplary embodiments, the upper electrode 340 is disposed over the light emitting layer 330 in the display region 10. In addition, the upper electrode 340 overlaps the light emitting layer 330 in the first module region 20. In other words, the upper electrode 340 has a second opening 341 that overlaps the first opening 331 and that exposes the top surface of the lower spacer 510 in each transmissive region 21 in the first module region 20. In this case, the upper electrode 340 overlaps at least a part of the side surface of the lower spacer 510. Moreover, the upper electrode 340 has a fourth opening 342 that overlaps the third opening 332 and that exposes the top surface of the lower structure 610 in the transmissive region 21 in the second module region 30. In this case, the upper electrode 340 overlaps at least a part of the side surface of the lower structure 610. Accordingly, the upper electrode 340 has second openings 341 in the first module region 20 and fourth opening 342 in the second module region 30, so that external light incident thereon can easily propagate through the transmissive regions 21 in the first module region 20 and in the second module region 30.

In exemplary embodiments, locations of the first opening 331 and the second opening 341 respectively correspond to each of the transmissive regions 21 in the first module region 20, and locations of the third opening 332 and the fourth opening 342 correspond to the transmissive region 21 in the second module region 30.

According to an embodiment, the upper electrode 340 may include one or more of a metal, an alloy, a metal nitride, a conductive metal oxide, a transparent conductive material, etc. These may be used alone or in combination with each other. Alternatively, in other embodiments, the upper electrode 340 has a multilayer structure that includes a plurality of layers.

The OLED display device 500 according to exemplary embodiments of the present disclosure includes the lower spacers 510 and the lower structure 610. In a method of manufacturing the OLED display device 500, an abrasive tape is used to form the first openings 331, the second openings 341, the third opening 332, and the fourth opening 342 in the light emitting layer 330 and the upper electrode 340 in the first module region 20 and the second module region 30. A part of the light emitting layer 330 and the upper electrode 340 is removed in the first module region 20 and the second module region 30 using the abrasive tape. Since the OLED display device 500 includes the lower spacers 510 and the lower structure 610, levels of the light emitting layer 330 and the upper electrode 340 to be removed by the abrasive tape are relatively high. Accordingly, an abrasion process of the abrasive tape can be easily performed. For example, when the OLED display device 500 lacks the lower spacers 510 and the substructure 610, the abrasion process can be challenging because the abrasive tape has to remove the light emitting layer 330 and the upper electrode 340 inside the openings 301 and 302 of the pixel defining layer 310.

Figure 14:
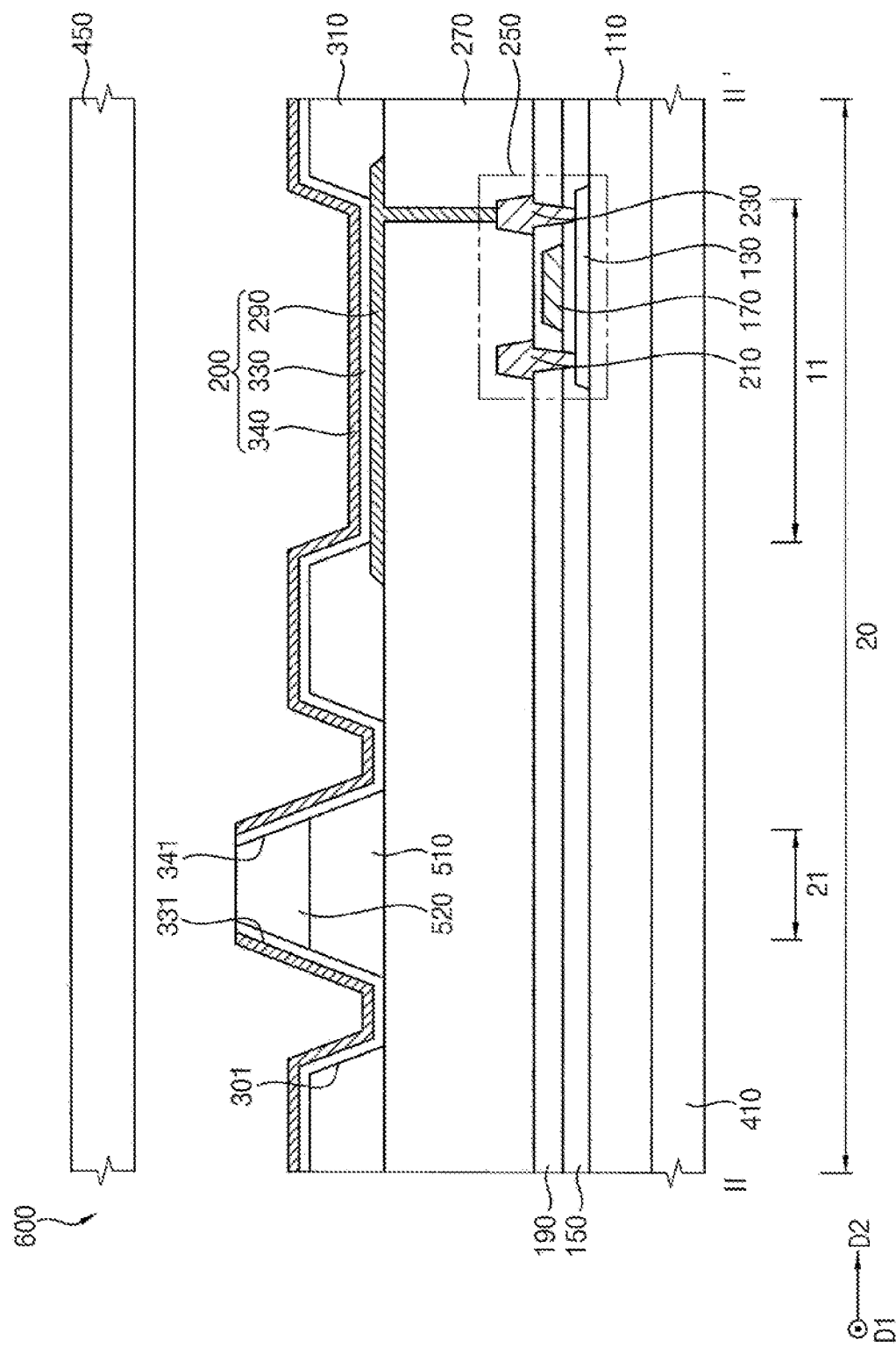
FIGS. 14 and 15 are sectional views of an OLED display device according to exemplary embodiments of the present disclosure.
Figure 15:
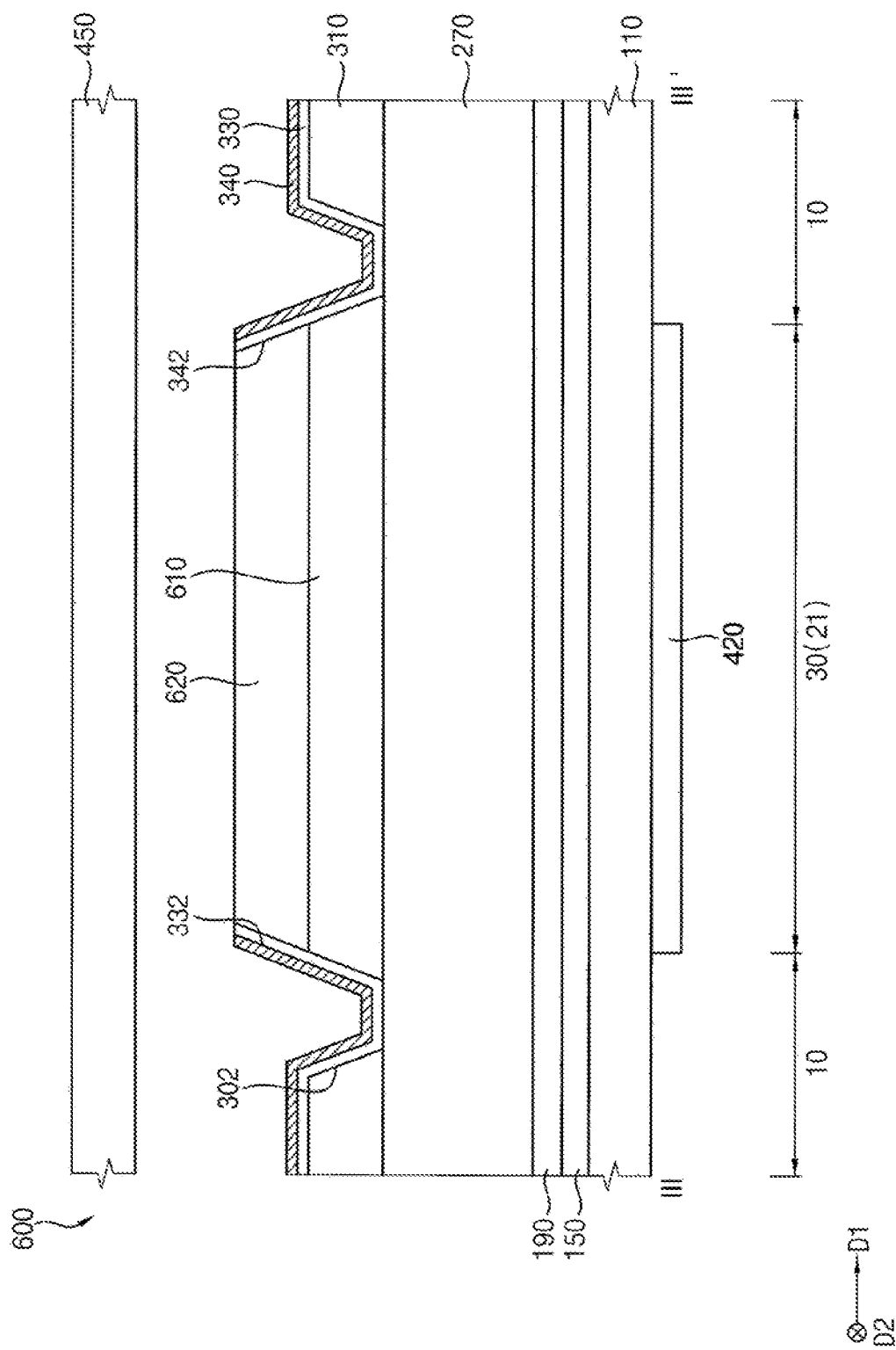

FIGS. 14 and 15 are sectional views of an OLED display device according to exemplary embodiments of the present disclosure. For example, FIG. 14 is a sectional view taken along line II-II' of FIG. 6, and FIG. 15 is a sectional view taken along line III-III' of FIG. 4. An organic light emitting diode display device 600 illustrated in FIGS. 14 and 15 has a configuration substantially identical or similar to the OLED display device 500 described with reference to FIGS. 12 and 13 except for an upper spacer 520 and an upper structure 620. In FIGS. 14 and 15, redundant descriptions for elements substantially identical or similar to the elements described with reference to FIGS. 12 and 13 will be omitted.

Referring to FIGS. 9, 14, and 15, according to an embodiment, the OLED display device 600 includes a lower substrate 110, semiconductor elements 250, a gate insulating layer 150, an insulating interlayer 190, a planarization layer 270, a pixel defining layer 310, lower spacers 510, upper spacers 520, a lower structure 610, an upper structure 620, sub-pixel structures 200, an upper substrate 450, a first functional module 410, a second functional module 420, etc. In this case, each of the sub-pixel structures 200 includes a lower electrode 290, a light emitting layer 330, and an upper electrode 340.

According to an embodiment, the upper spacers 520 are disposed on the lower spacers 510. For example, each of the upper spacers 520 is disposed in the opening 301 of the pixel defining layer 310 in the first module region 20, and is spaced apart from the pixel defining layer 310. In exemplary embodiments, a top surface of each of the upper spacers 520 is located at a higher level than a top surface of the pixel defining layer 310. Each of the upper spacers 520 includes an organic material. For example, each of the upper spacers 520 may be one of a photoresist, a polyacrylic resin, a polyimide-based resin, a polyamide-based resin, a siloxane-based resin, an acrylic resin, an epoxy-based resin, etc.

According to an embodiment, the upper structure 620 is disposed on the lower structure 610. For example, the upper structure 620 is disposed in the opening 302 of the pixel defining layer 310 in the second module region 30, and is spaced apart from the pixel defining layer 310. In exemplary embodiments, a top surface of the upper structure 620 is located at a higher level than the top surface of the pixel defining layer 310 and a top surface of the lower spacer 510. The upper structure 620 includes an organic material.

According to an embodiment, the light emitting layer 330 is disposed on the pixel defining layer 310, the lower electrode 290, a part of the lower spacer 510 and the upper spacer 520, a part of the lower structure 610 and the upper structure 620, and a part of the planarization layer 270 in the display region 10 and a part of the first module region 20 and is omitted from the second module region 30. In exemplary embodiments, the light emitting layer 330 is disposed over the pixel defining layer 310 and the lower electrode 290 in the display region 10. In addition, the light emitting layer 330 is disposed on the lower electrode 290 in each of the sub-pixel regions 11 and the pixel defining layer 310 in the first module region 20 but not in the transmissive region 21. In other words, the light emitting layer 330 has a first opening 331 that exposes the top surface of the upper spacer 520 in each of the transmissive regions 21 in the first module region 20. In this case, the light emitting layer 330 are disposed on at least a part of a side surface of the upper spacer 520. Moreover, the light emitting layer 330 has a third opening 332 that exposes the top surface of the upper spacer 520 in the transmissive region 21 in the second module region 30. In this case, the light emitting layer 330 is disposed on at least a part of the side surface of the upper spacer 520. Accordingly, the light emitting layer 330 has first openings 331 in the first module region 20 and the third opening 332 in the second module region 30, so that external light incident thereon can easily propagate through the transmissive regions 21 in the first module region 20 and in the second module region 30.

According to an embodiment, an organic light emission layer (EML) of the light emitting layer 330 is formed by using at least one light emitting material that emits different colors, according to sub-pixels. Alternatively, in other embodiments, the organic light emission layer (EML) of the light emitting layer 330 is formed by laminating a plurality of light emitting materials that emit different colors, such as red light, green light, and blue light, to emit white light as a whole.

According to an embodiment, the upper electrode 340 is disposed on the light emitting layer 330 in the display region 10 and a part of the first module region 20, and but not in the second module region 30. In exemplary embodiments, the upper electrode 340 is disposed over the light emitting layer 330 in the display region 10. In addition, the upper electrode 340 overlaps the light emitting layer 330 in the first module region 20. In other words, the upper electrode 340 has a second opening 341 that overlaps the first opening 331 and that exposes the top surface of the upper spacer 520 in each transmissive region 21 in the first module region 20. In this case, the upper electrode 340 overlaps at least a part of the side surface of the upper spacer 520. Moreover, the upper electrode 340 has a fourth opening 342 that overlaps the third opening 332 that exposes the top surface of the upper structure 620 in the transmissive region 21 in the second module region 30. In this case, the upper electrode 340 overlaps at least a part of the side surface of the upper structure 620. Accordingly, the upper electrode 340 second openings 341 in the first module region 20 and the fourth opening 342 in the second module region 30, so that external light incident thereon can easily propagate through the transmissive regions 21 in the first module region 20 and the second module region 30.

In exemplary embodiments, locations of the first opening 331 and the second opening 341 respectively correspond to each of the transmissive regions 21 in the first module region 20, and a location of the third opening 332 and the fourth opening 342 corresponds to the transmissive region 21 in the second module region 30.

According to an embodiment, the upper electrode 340 may include one or more of a metal, an alloy, a metal nitride, a conductive metal oxide, a transparent conductive material, etc. These may be used alone or in combination with each other. Alternatively, in other embodiments, the upper electrode 340 has a multilayer structure that includes a plurality of layers.

The OLED display device 600 according to exemplary embodiments of the present disclosure includes the lower spacers 510, the upper spacers 520, the lower structure 610, and the upper structure 620. In a method of manufacturing the OLED display device 600, an abrasive tape is used to form the first openings 331, the second openings 341, the third opening 332, and the fourth opening 342 in the light emitting layer 330 and the upper electrode 340 in the first module region 20 and the second module region 30. A part of the light emitting layer 330 and the upper electrode 340 is removed in the first module region 20 and the second module region 30 by using the abrasive tape. Since the OLED display device 600 includes the lower spacers 510, the upper spacers 520, the lower structure 610, and the upper structure 620, levels of the light emitting layer 330 and the upper electrode 340 to be removed by the abrasive tape are relatively high. Accordingly, an abrasion process of the abrasive tape can be easily performed. For example, since the light emitting layer 330 and the upper electrode 340 disposed in the transmissive regions 21 in the first module region 20 and the second module region 30 protrude, the abrasive tape can be fixed at the same position to remove the light emitting layer 330 and the upper electrode 340. Alternatively, in other embodiments, since the light emitting layer 330 and the upper electrode 340 in the transmissive regions 21 in the first module region 20 and the second module region 30 protrude, a relatively large abrasive tape can be used to simultaneously remove the light emitting layer 330 and the upper electrode 340 from a relatively large number of upper spacers 520.

FIGS. 16 to 31 are sectional views that illustrate a method of manufacturing an organic light emitting diode display device according to exemplary embodiments of the present disclosure.

Figure 16:
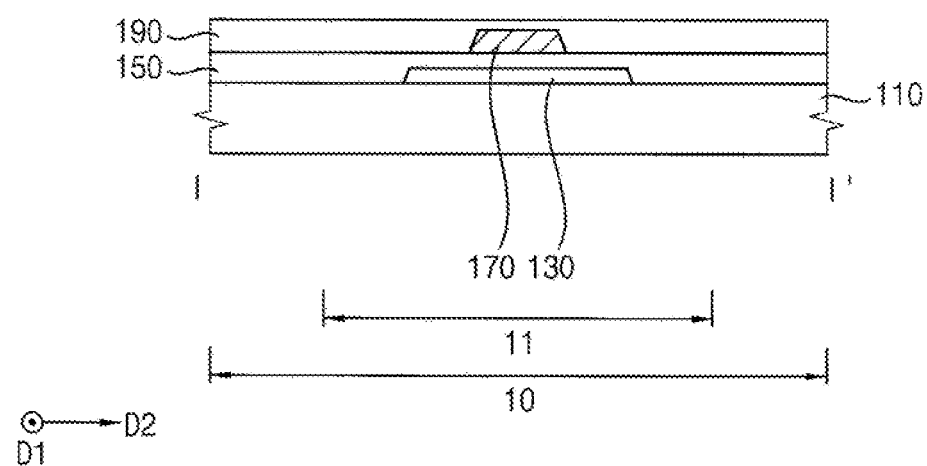
FIGS. 16 to 31 are sectional views that illustrate a method of manufacturing an organic light emitting diode display device according to exemplary embodiments of the present disclosure.
Figure 17:
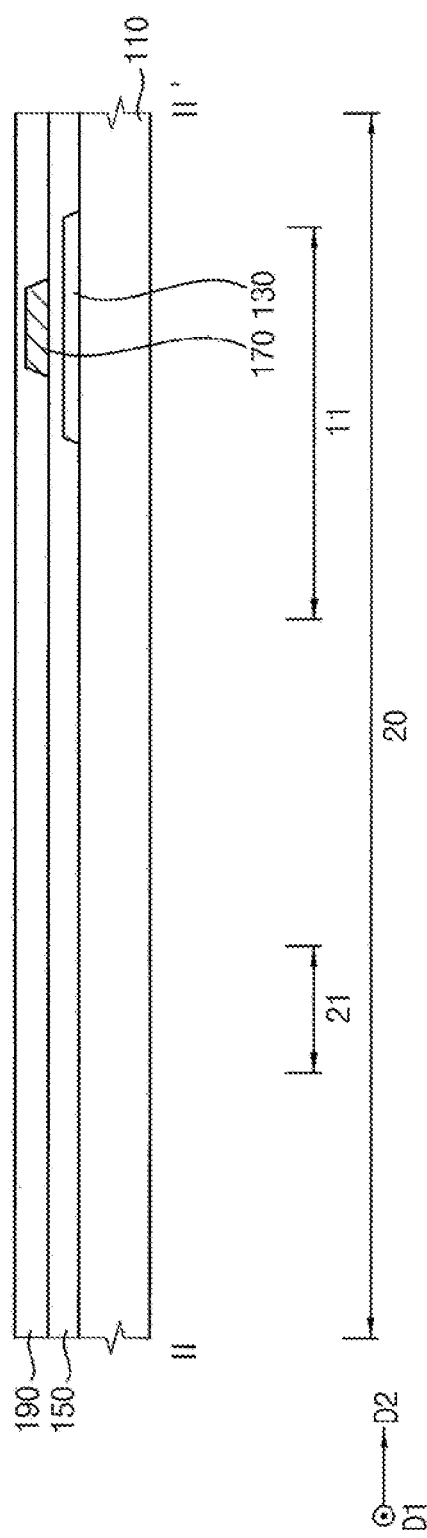
Figure 18:
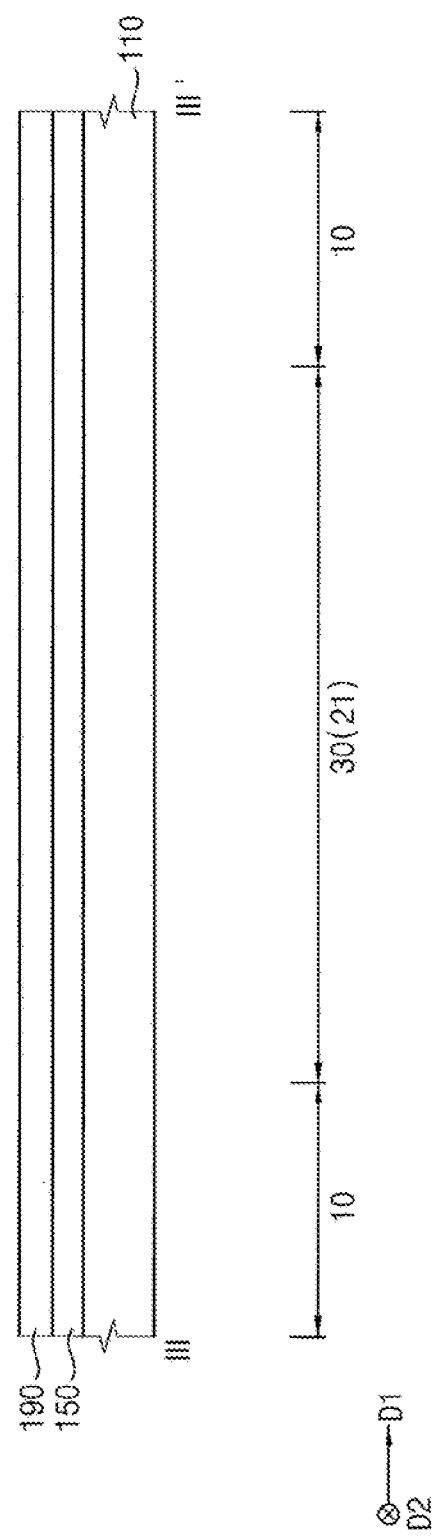

Referring to FIGS. 16, 17, and 18, according to an embodiment, the lower substrate 110 is provided that includes a transparent or opaque material. The lower substrate 110 may be formed by using a quartz substrate, a synthetic quartz substrate, a calcium fluoride substrate, a fluorine-doped quartz substrate (F-doped quartz substrate), a soda lime glass substrate, a non-alkali glass substrate, etc.

According to an embodiment, a buffer layer is disposed on the lower substrate 110. The buffer layer is disposed over the lower substrate 110. The buffer layer prevents metal atoms or impurities from diffusing from the lower substrate 110 into the upper structure, and controls a heat transfer rate during a crystallization process that forms the active layer to obtain a substantially uniform active layer. In addition, the buffer layer improves flatness of a surface of the lower substrate 110 when the surface of the lower substrate 110 is not uniform. Depending on a type of the lower substrate 110, at least two buffer layers are provided on the lower substrate 110, or the buffer layer is omitted from the lower substrate 110. The buffer layer may be formed from an organic material or an inorganic material.

According to an embodiment, active layers 130 are formed on the lower substrate 110 in the sub-pixel regions 11 in the display region 10 and the first module region 20. In other words, the active layer 130 are not formed in the second module region 30. The active layers 130 may include one or more of an oxide semiconductor, an inorganic semiconductor, an organic semiconductor, etc. Each of the active layers 130 has a channel region, a source region, and a drain region.

According to an embodiment, the gate insulating layer 150 is formed on the active layers 130 and the lower substrate 110 in the display region 10, the first module region 20, and the second module region 30. In exemplary embodiments, the gate insulating layer 150 is formed over the lower substrate 110. For example, the gate insulating layer 150 covers the active layers 130 on the lower substrate 110, and has a substantially flat top surface without steps around the active layers 130. Alternatively, in other embodiments, the gate insulating layer 150 covers the active layers 130 on the lower substrate 110 with a uniform thickness. The gate insulating layer 150 may be formed by using a silicon compound, a metal oxide, etc. For example, the gate insulating layer 150 may include one or more of silicon oxide, silicon nitride, silicon oxynitride, silicon oxycarbide, silicon carbonitride, aluminum oxide, aluminum nitride, tantalum oxide, hafnium oxide, zirconium oxide, titanium oxide, etc. In other exemplary embodiments, the gate insulating layer 150 has a multilayer structure that includes a plurality of insulating layers formed of different materials.

According to an embodiment, gate electrodes 170 are formed on the gate insulating layer 150 in the sub-pixel regions 11 in the display region 10 and the first module region 20. In other words, the gate electrodes 170 are not formed in the second module region 30. For example, each of the gate electrodes 170 is formed on a portion of the gate insulating layer 150 under which each of the active layers 130 is located, i.e., to overlap channel region of active layer 130. Each of the gate electrodes 170 may be formed by using one or more of a metal, an alloy, a metal nitride, a conductive metal oxide, a transparent conductive material, etc. For example, each of the gate electrodes 170 may include one or more of gold, silver, aluminum, platinum, nickel, titanium, palladium, magnesium, calcium, lithium, chromium, tantalum, tungsten, copper, molybdenum, scandium, neodymium, iridium, a gold-containing alloy, a silver-containing alloy, an aluminum-containing alloy, a platinum-containing alloy, a chromium-containing alloy, a copper-containing alloy, a molybdenum-containing alloy, aluminum nitride, titanium nitride, chromium nitride, tantalum nitride, tungsten nitride, strontium ruthenium oxide, zinc oxide, tin oxide, indium oxide, gallium oxide, indium tin oxide, indium zinc oxide, etc. These may be used alone or in combination with each other. Alternatively, in other embodiments, each of the gate electrodes 170 has a multilayer structure that includes a plurality of layers.

According to an embodiment, the insulating interlayer 190 is formed on the gate electrodes 170 and the gate insulating layer 150 in the display region 10, the first module region 20, and the second module region 30. In exemplary embodiments, the insulating interlayer 190 is formed over the gate insulating layer 150. For example, the insulating interlayer 190 covers the gate electrodes 170 on the gate insulating layer 150, and has a substantially flat top surface without steps around the gate electrodes 170. Alternatively, in other embodiments, the insulating interlayer 190 covers the gate electrodes 170 on the gate insulating layer 150 with a uniform thickness. The insulating interlayer 190 may be formed by using one of a silicon compound, a metal oxide, etc. In other exemplary embodiments, the insulating interlayer 190 has a multilayer structure that includes a plurality of insulating layers formed of different materials.

Figure 19:
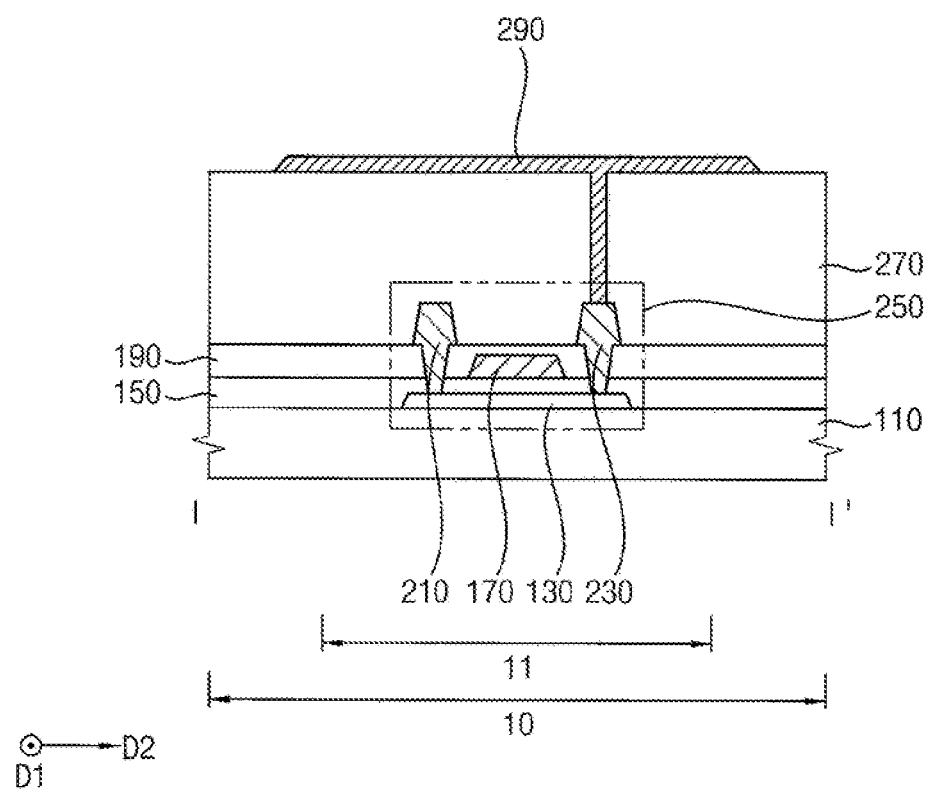
Figure 20:
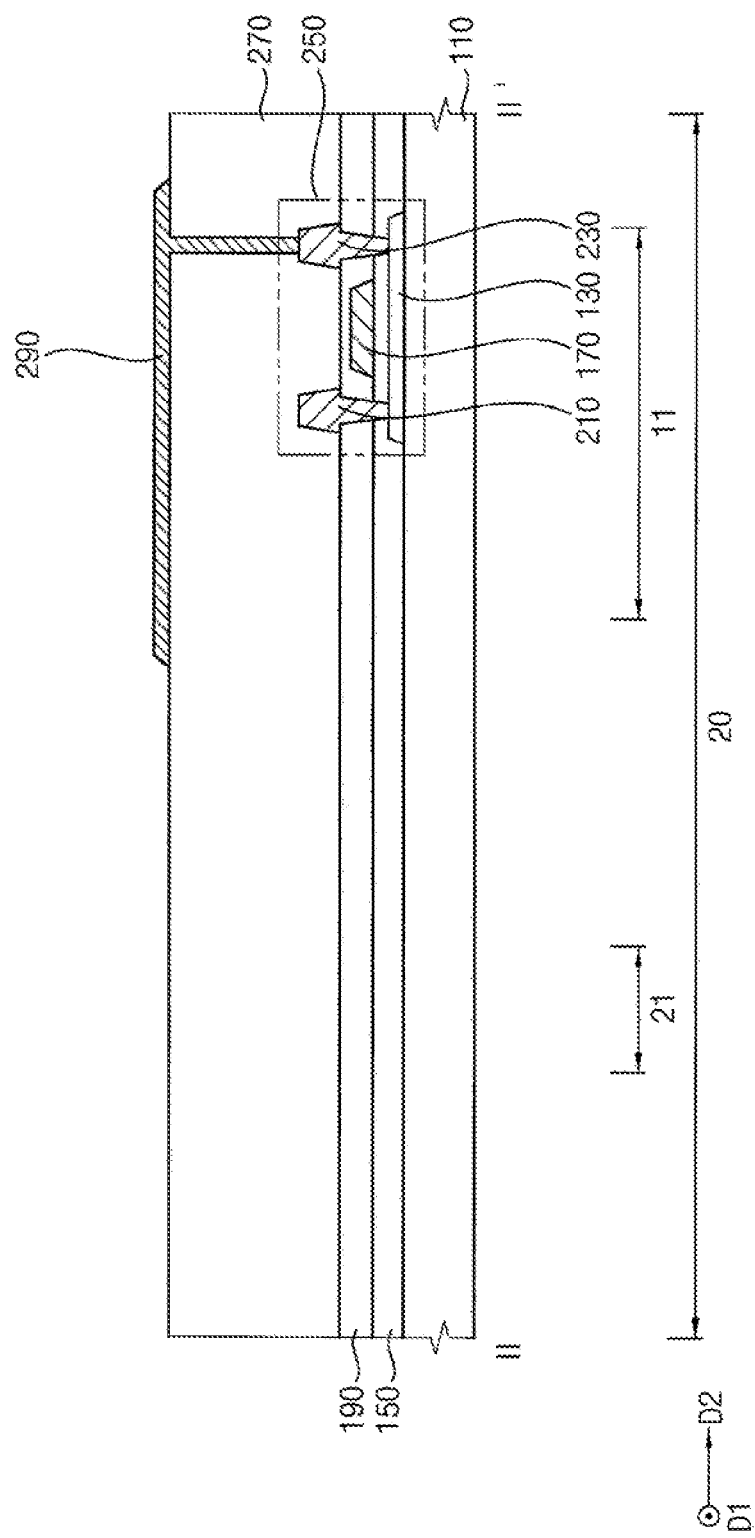
Figure 21:
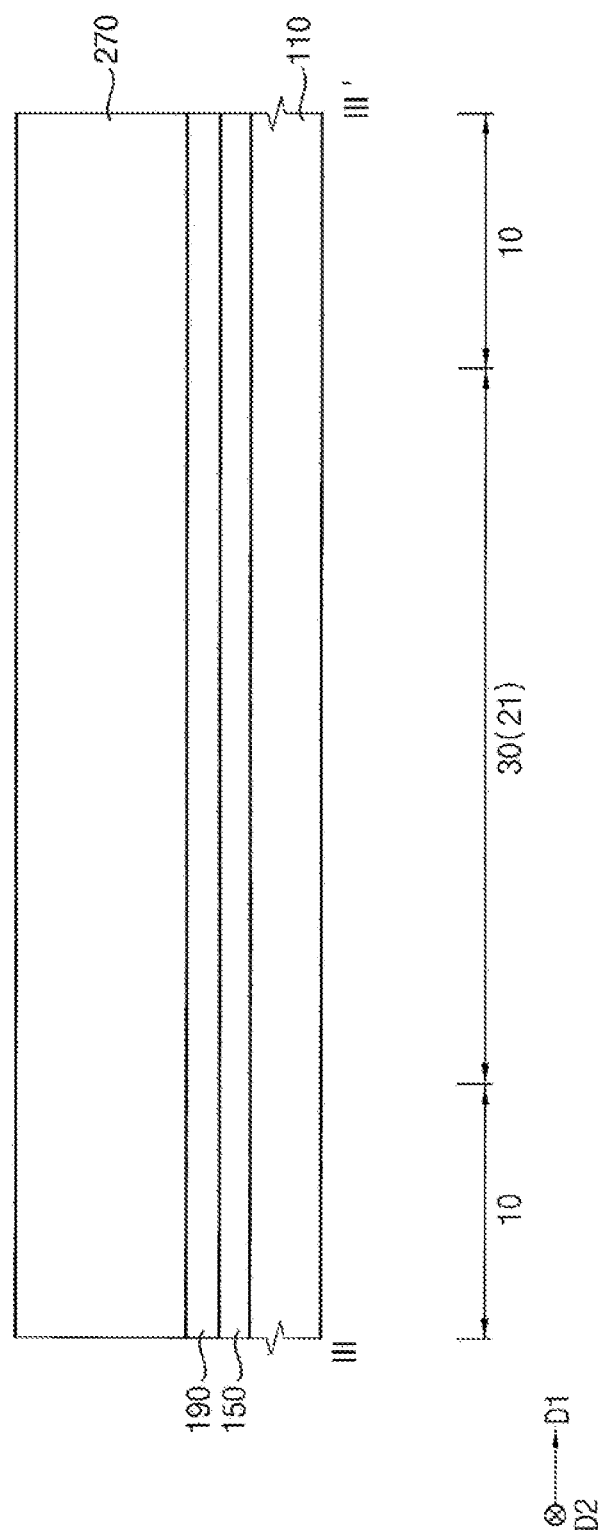

Referring to FIGS. 19, 20, and 21, according to an embodiment, source electrodes 210 and drain electrodes 230 are formed on the insulating interlayer 190 in the sub-pixel regions 11 in the display region 10 and the first module region 20. Each of the source electrodes 210 is connected to the source region of each of the active layers 130 through a contact hole formed by removing first portions of the gate insulating layer 150 and the insulating interlayer 190, and each of the drain electrodes 230 is connected to the drain region of each of the active layers 130 through a contact hole formed by removing second portions of the gate insulating layer 150 and the insulating interlayer 190. Each of the source electrodes 210 and the drain electrodes 230 may be formed by using one or more of a metal, an alloy, a metal nitride, a conductive metal oxide, a transparent conductive material, etc. These may be used alone or in combination with each other. Alternatively, in other embodiments, each of the source electrodes 210 and the drain electrodes 230 has a multilayer structure that includes a plurality of layers.

Accordingly, according to an embodiment, the semiconductor element 250 that includes the active layer 130, the gate electrode 170, the source electrode 210, and the drain electrode 230 is formed in each of the sub-pixel regions 11 in the display region 10 and the first module region 20. In other words, the semiconductor element 250 is not formed in the second module region 30.

According to an embodiment, the planarization layer 270 is formed on the insulating interlayer 190 and the semiconductor elements 250 in the display region 10, the first module region 20, and the second module region 30, and the planarization layer 270 is formed with contact holes that expose a part of the drain electrode 230 in each of the sub-pixel regions 11 in the display region 10 and the first module region 20. In exemplary embodiments, the planarization layer 270 is formed over the insulating interlayer 190. The planarization layer 270 is sufficiently thick to cover the semiconductor elements 250, and in this case, the planarization layer 270 has a substantially flat top surface. To implement a flat top surface of the planarization layer 270, a planarization process is additionally performed on the planarization layer 270. The planarization layer 270 is formed by using an organic material.

According to an embodiment, the lower electrodes 290 is formed on the planarization layer 270 in the sub-pixel regions 11 in the display region 10 and the first module region 20. For example, the lower electrode 290 in each of the sub-pixel regions 11 in the display region 10 makes direct contact with the drain electrode 230 in each of the sub-pixel regions 11 in the display region 10 through the contact hole of the planarization layer 270, and the lower electrode 290 in each of the sub-pixel regions 11 in the display region 10 is electrically connected to the semiconductor element 250 in each of the sub-pixel regions 11 in the display region 10. In addition, the lower electrode 290 in each of the sub-pixel regions 11 in the first module region 20 makes direct contact with the drain electrode 230 in each of the sub-pixel regions 11 in the first module region 20 through the contact hole, and the lower electrode 290 in each of the sub-pixel regions 11 in the first module region 20 is electrically connected to the semiconductor element 250 in each of the sub-pixel regions 11 in the first module region 20. Each of the lower electrodes 290 may be formed by using one or more of a metal, an alloy, a metal nitride, a conductive metal oxide, a transparent conductive material, etc. These may be used alone or in combination with each other. In other exemplary embodiments, each of the lower electrodes 290 has a multilayer structure that includes a plurality of layers.

Figure 22:
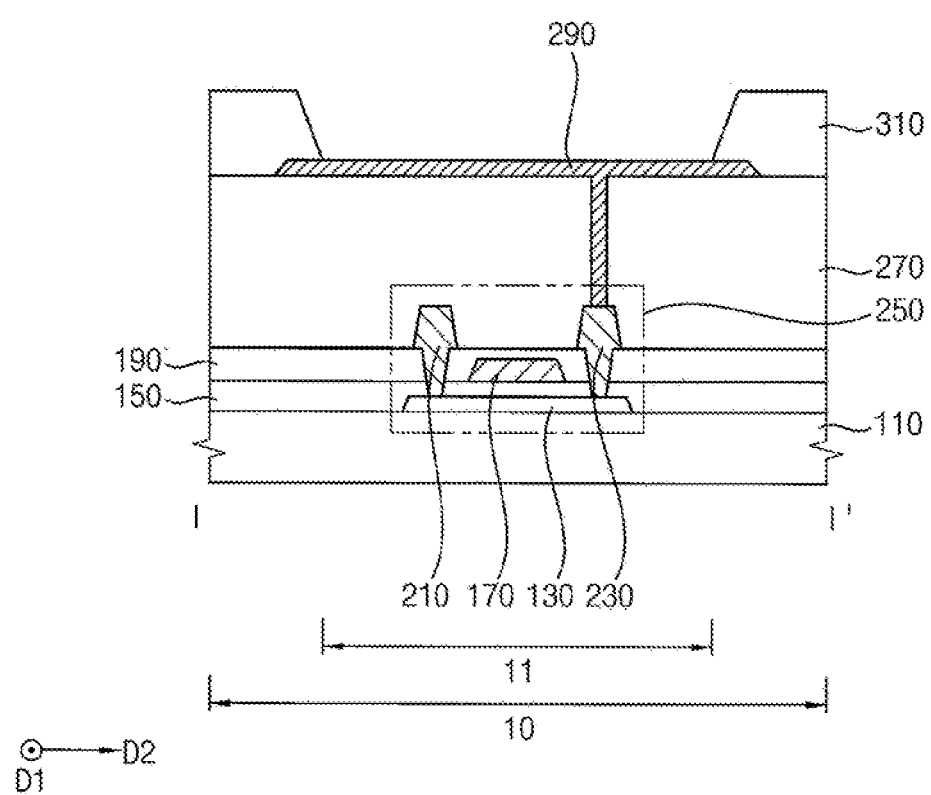
Figure 23:
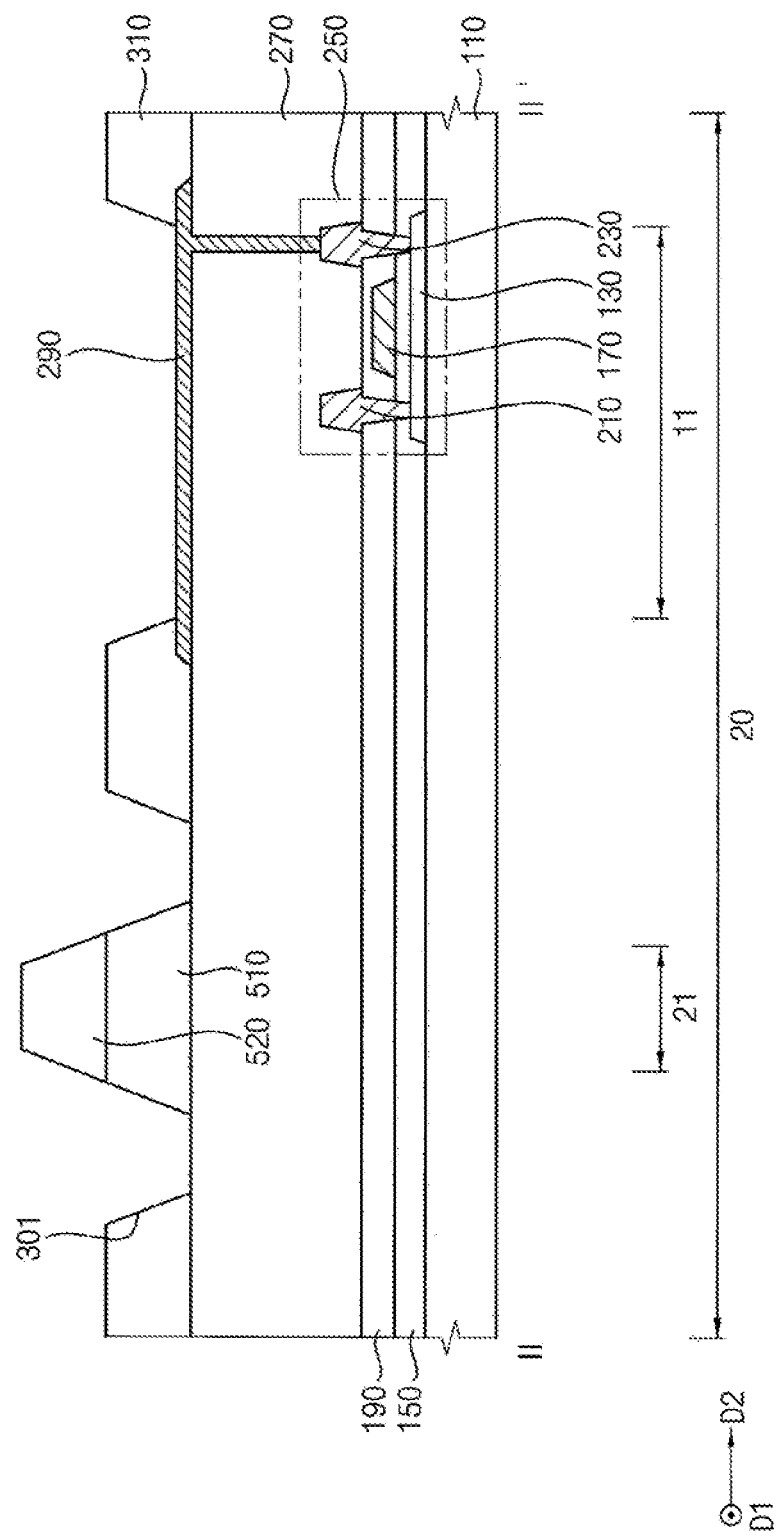
Figure 24:
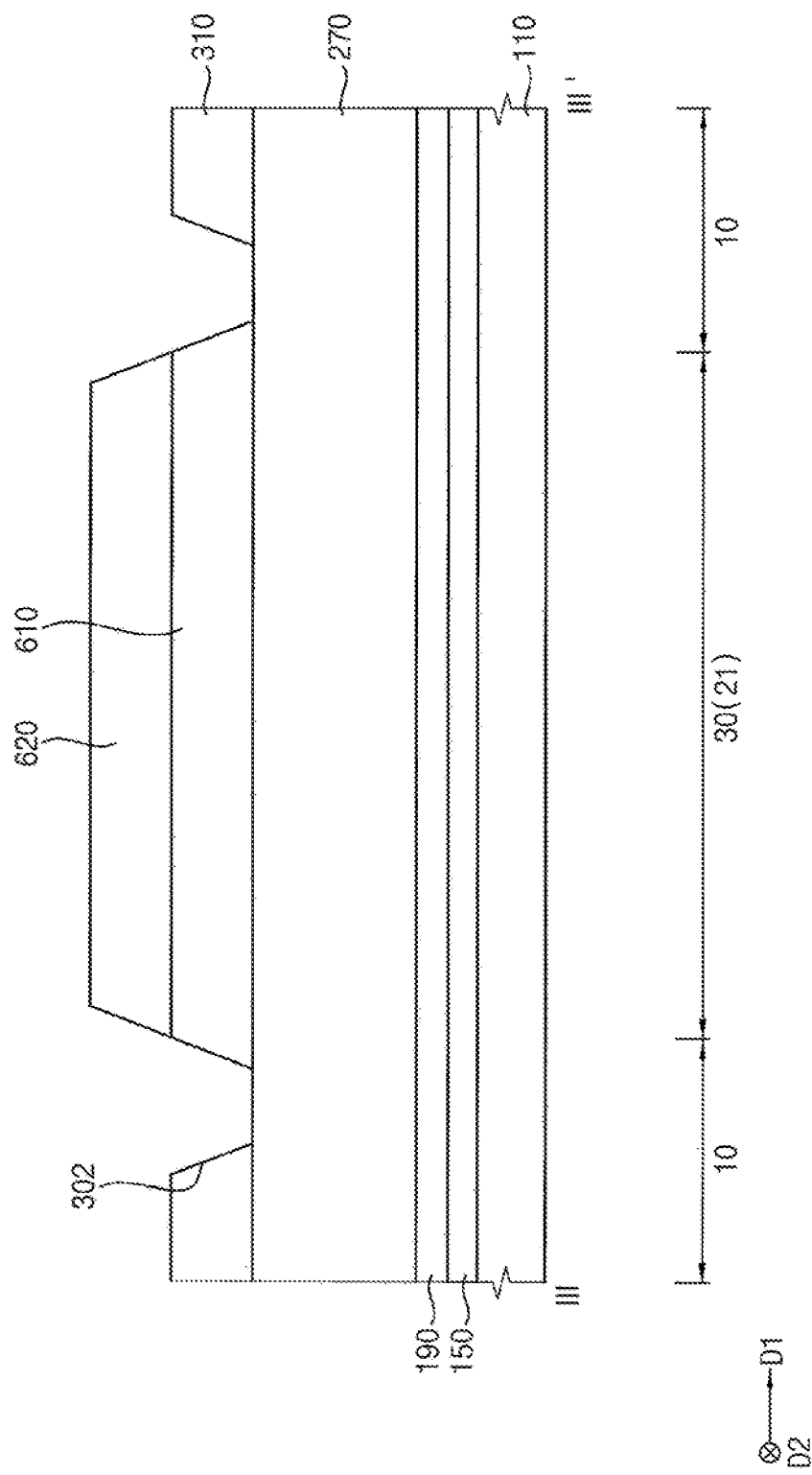

Referring to FIGS. 22, 23, and 24, according to an embodiment, the pixel defining layer 310 is disposed on the planarization layer 270 in the display region 10 and the first module region 20. In other words, the pixel defining layer 310 is not disposed in the second module region 30. For example, the pixel defining layer 310 covers both sides of each of the lower electrodes 290, and has an opening that exposes a part of a top surface of each of the lower electrodes 290. In exemplary embodiments, the pixel defining layer 310 has an opening 301 in the first module region 20 that exposes a top surface of the planarization layer 270 in the transmissive regions 21 in the first module region 20 or in the first module region 20 adjacent to each of the transmissive regions 21, and the pixel defining layer 310 has an opening 302 in the display region 10 that exposes the top surface of the planarization layer 270 in the second module region 30. The pixel defining layer 310 is formed by using an organic material. Alternatively, in other embodiments, the pixel defining layer 310 is formed in the transmissive region 21 in the second module region 30. In this case, the pixel defining layer 310 is formed by using a transparent material.

According to an embodiment, lower spacers 510 are formed on the planarization layer 270 in the first module region 20. For example, each of the lower spacers 510 is formed in the opening 301 of the pixel defining layer 310 in the first module region 20, and is spaced apart from the pixel defining layer 310. Each of the lower spacers 510 is formed from an organic material. For example, each of the lower spacers 510 may be one of a photoresist, a polyacrylic resin, a polyimide-based resin, a polyamide-based resin, a siloxane-based resin, an acrylic resin, an epoxy-based resin, etc.

According to an embodiment, a lower structure 610 is formed on the planarization layer 270 in the second module region 30. For example, the lower structure 610 is formed in the opening 302 of the pixel defining layer 310 in the second module region 30, and is spaced apart from the pixel defining layer 310. The lower structure 610 is formed from an organic material. In exemplary embodiments, the lower structure 610, the pixel defining layer 310, and the lower spacer 510 are simultaneously formed from the same material on the same layer.

According to an embodiment, upper spacers 520 are formed on the lower spacers 510. For example, each of the upper spacers 520 is formed in the opening 301 of the pixel defining layer 310 in the first module region 20, and is spaced apart from the pixel defining layer 310. Each of the upper spacers 520 is formed from an organic material.

According to an embodiment, an upper structure 620 is disposed on the lower structure 610. For example, the upper structure 620 is formed in the opening 302 of the pixel defining layer 310 in the second module region 30, and is spaced apart from the pixel defining layer 310. The upper structure 620 is formed from an organic material. In exemplary embodiments, the upper spacer 520 and the upper structure 620 are simultaneously formed from the same material.

Figure 25:
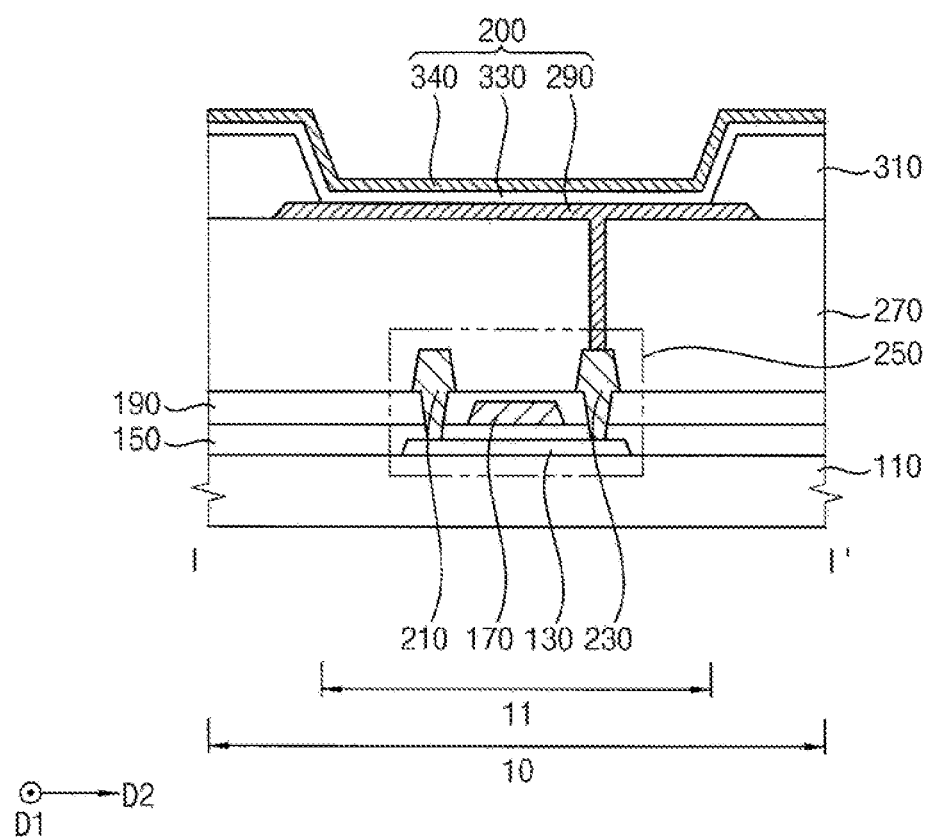
Figure 26:
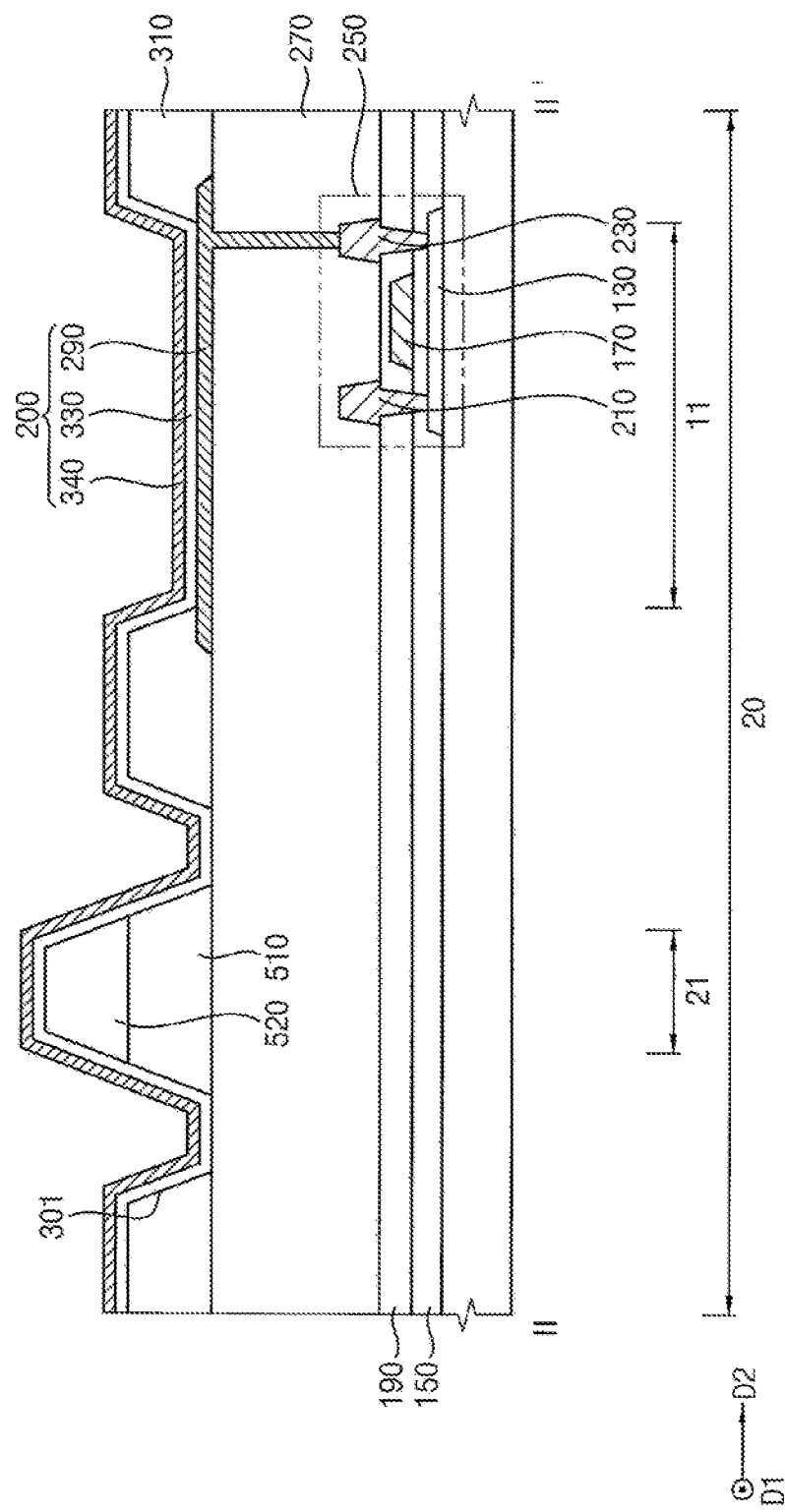
Figure 27:
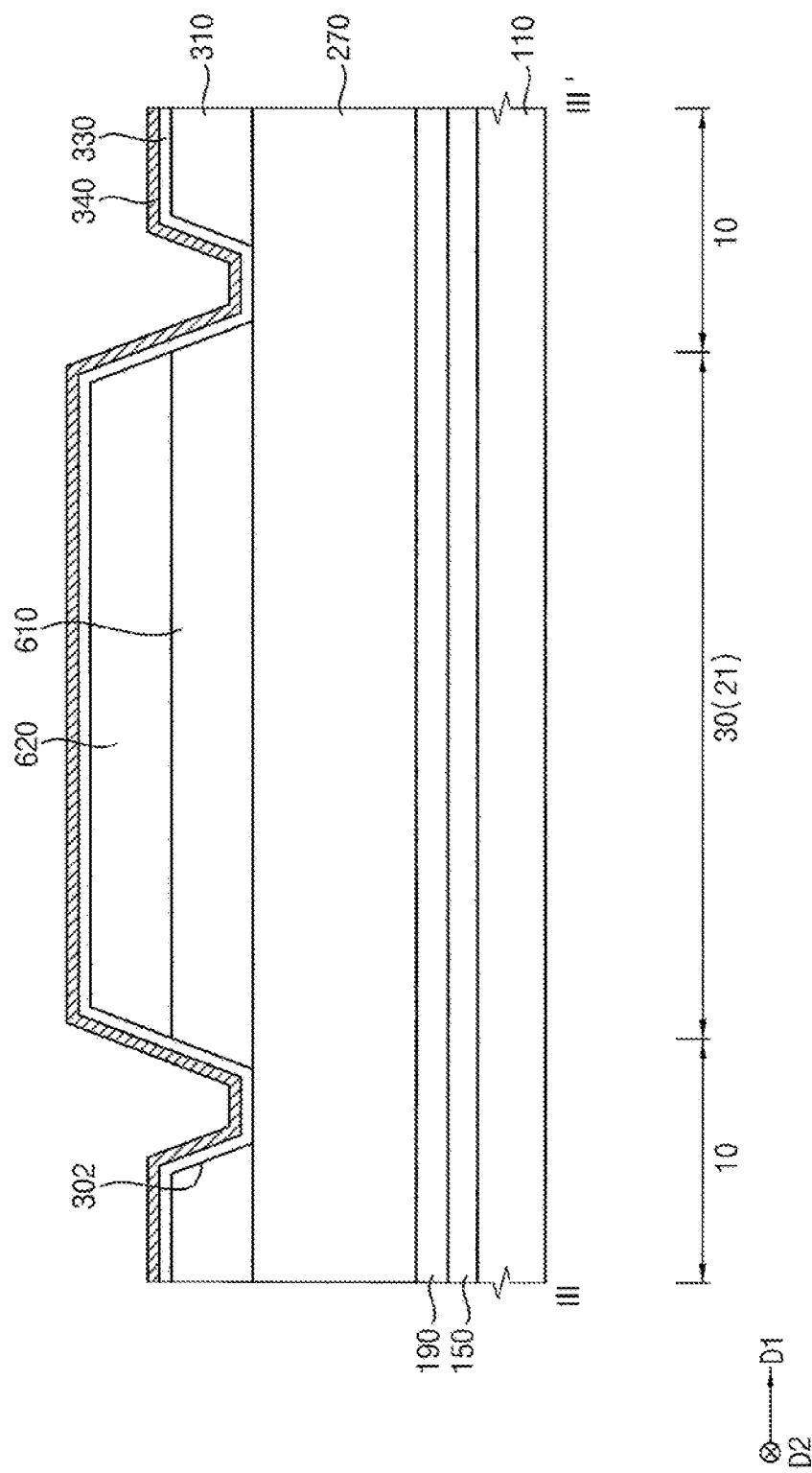

Referring to FIGS. 25, 26, and 27, according to an embodiment, a light emitting layer 330 is formed on the pixel defining layer 310, the lower electrode 290, the lower spacer 510, the upper spacer 520, the lower structure 610, the upper structure 620, and the planarization layer 270 in the display region 10, the first module region 20, and the second module region 30. In other words, the light emitting layer 330 is formed over the lower substrate 110. The light emitting layer 330 has a multilayer structure that includes an organic light emission layer (EML), a hole injection layer (HIL), a hole transport layer (HTL), an electron transport layer (ETL), an electron injection layer (EIL), etc. The organic light emission layer (EML) of the light emitting layer 330 is formed from at least one light emitting material that emits different colors, according to sub-pixels. Alternatively, in other embodiments, the organic light emission layer (EML) of the light emitting layer 330 is formed by laminating a plurality of light emitting materials that emit different colors, such as red light, green light, and blue light, to emit white light as a whole.

According to an embodiment, the upper electrode 340 is formed on the light emitting layer 330 in the display region 10, the first module region 20, and the second module region 30. In other words, the upper electrode 340 is formed over the light emitting layer 330. The upper electrode 340 is formed from one or more of a metal, an alloy, a metal nitride, a conductive metal oxide, a transparent conductive material, etc. These may be used alone or in combination with each other. Alternatively, in other embodiments, the upper electrode 340 has a multilayer structure that includes a plurality of layers.

Accordingly, the sub-pixel structure 200 that includes the lower electrode 290, the light emitting layer 330, and the upper electrode 340 is formed in each of the sub-pixel regions 11 in the display region 10 and the first module region 20.

Figure 28:
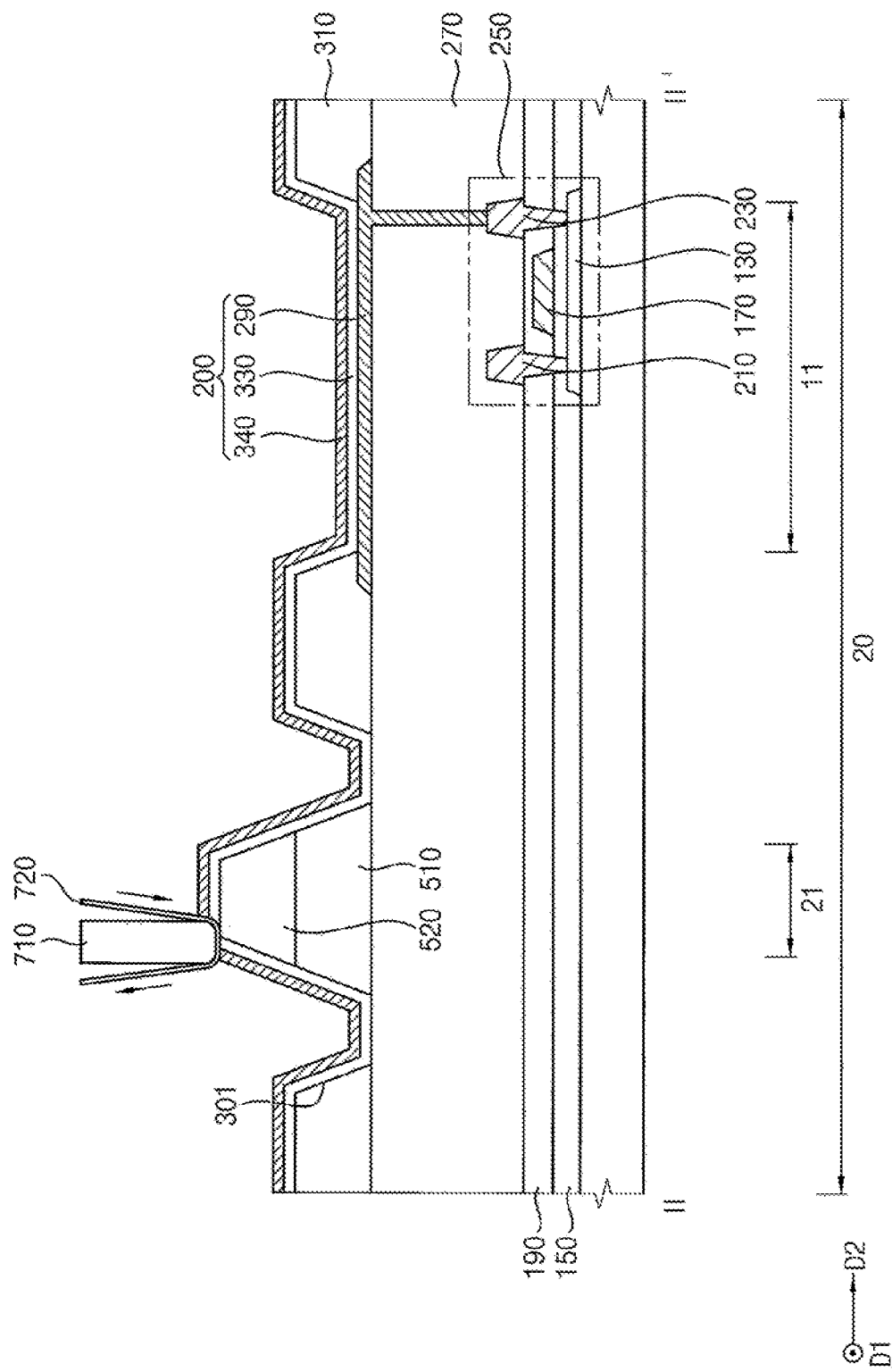
Figure 29:
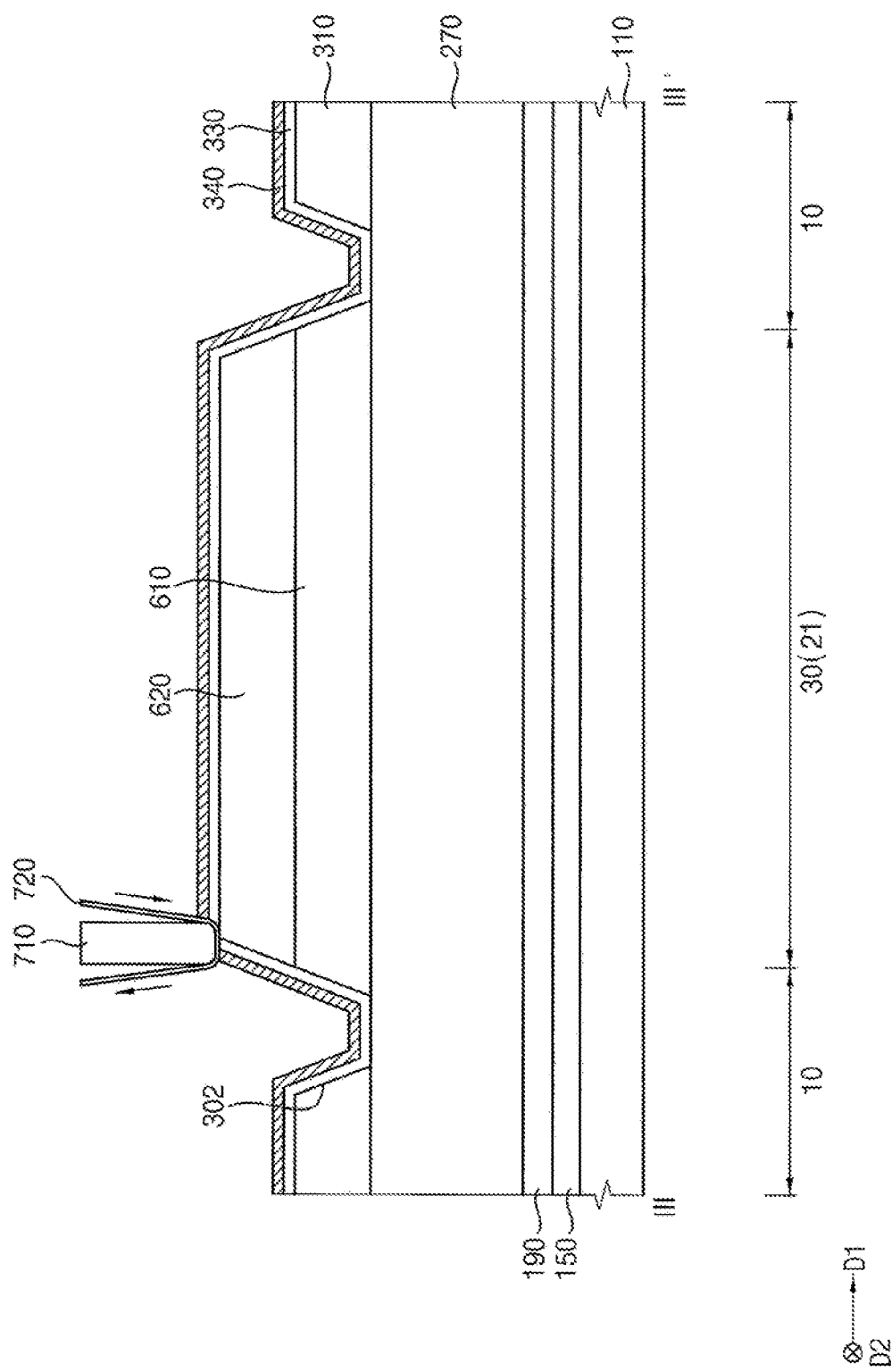

Referring to FIGS. 28 and 29, according to an embodiment, an abrasion process is performed using a tip 710 and an abrasive tape 720. The light emitting layer 330 and the upper electrode 340 formed on the upper spacer 520 and formed on the upper structure 620 are removed through the abrasion process. Alternatively, in other embodiments, since the light emitting layer 330 and the upper electrode 340 in the transmissive regions 21 in the first module region 20 and the second module region 30 protrude, the tip 710 and the abrasive tape 720 can be used to simultaneously remove the light emitting layer 330 and the upper electrode 340 from a relatively large number of upper spacers 520.

For example, in a conventional method of manufacturing an organic light emitting diode display device, an opening is formed in a part of a conventional organic light emitting diode display device to include the first functional module 410 and the second functional module 420. In this case, an image cannot be displayed where the opening is formed, and the conventional OLED display device may be damaged when forming the opening. In addition, when the light emitting layer 330 and the upper electrode 340 in the transmissive region 21 are removed through a mask process instead of the abrasion process, a mask may have openings with different patterns, or which are not bilaterally symmetric, to remove the light emitting layer 330 and the upper electrode 340 from the transmissive region 21. In this case, the mask does not obtain a uniform tensile force, which can cause defects in the light emitting layer 330 and the upper electrode 340. Moreover, when the light emitting layer 330 and the upper electrode 340 in the transmissive region 21 are removed through an etching process, particles and fumes can be generated, which can contaminate an adjacent light emitting layer 330. In other words, an abrasion process should be used to remove the light emitting layer 330 and the upper electrode 340 in the transmissive region 21.

Figure 30:
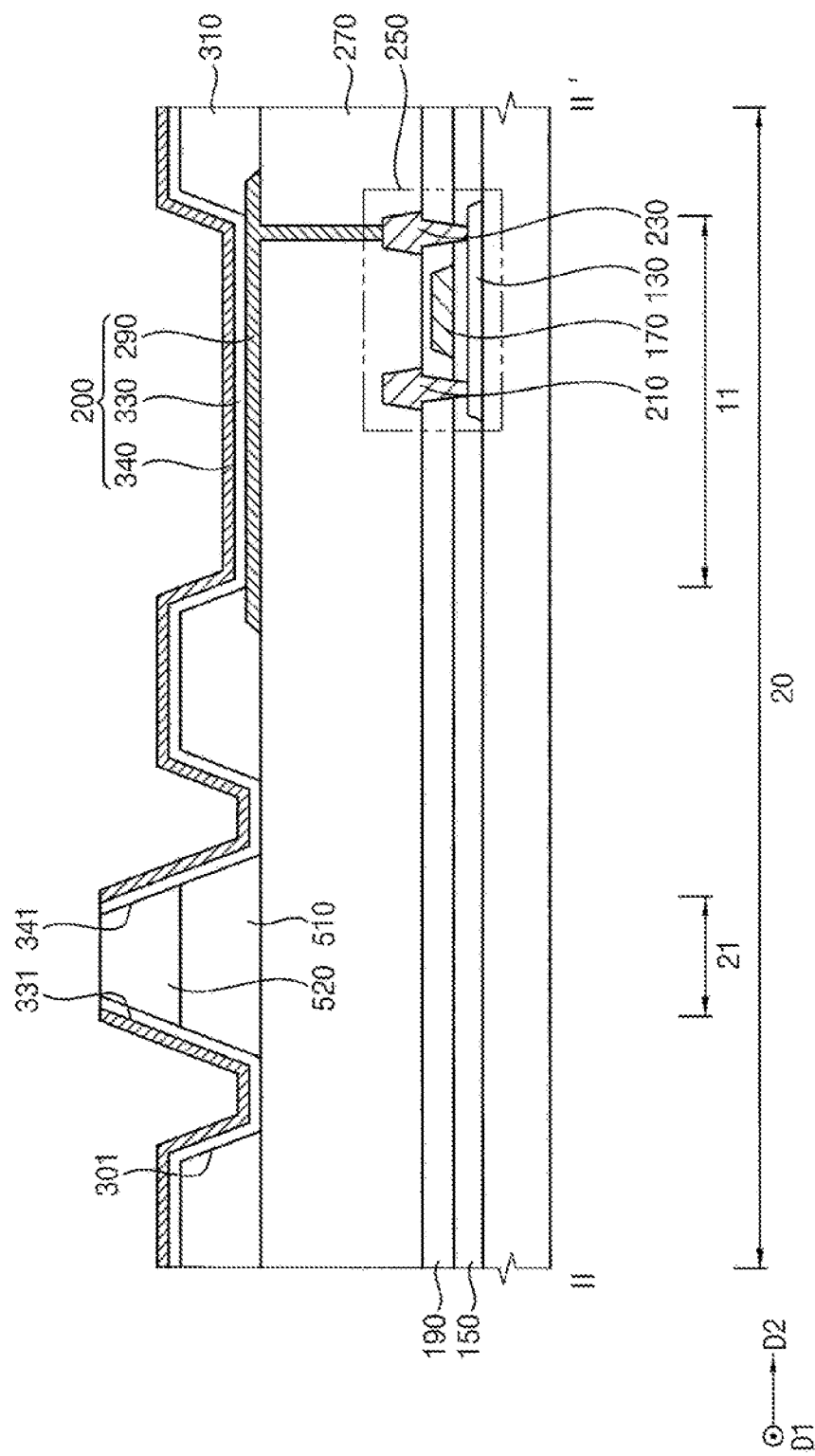
Figure 31:
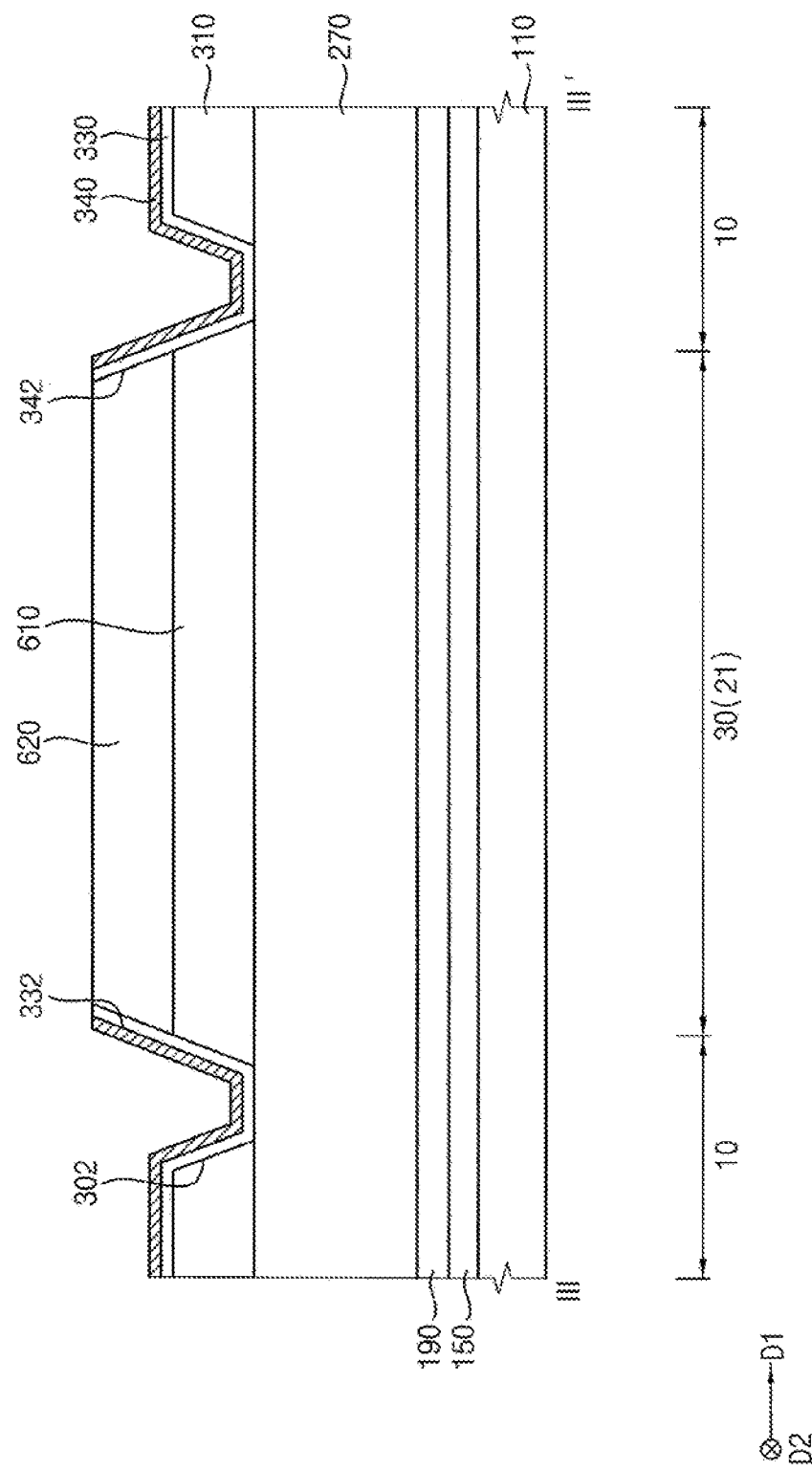

Referring to FIGS. 30 and 31, according to an embodiment, after the abrasion process, a first opening 331 that exposes a top surface of the upper spacer 520 is formed in the light emitting layer 330 in each transmissive region 21 in the first module region 20, and a third opening 332 that exposes a top surface of the lower structure 610 is formed in the light emitting layer 330 in the transmissive region 21 in the second module region 30. Accordingly, the light emitting layer 330 has first openings 331 formed in the first module region 20 and the third opening 332 formed in the second module region 30, so that external light incident thereon can easily propagate through the transmissive regions 21 in the first module region 20 and the second module region 30.

In addition, according to an embodiment, a second opening 341 that overlaps the first opening 331 that exposes the top surface of the upper spacer 520 is formed in the upper electrode 340 in each transmissive region 21 in the first module region 20, and a fourth opening 342 that overlaps the third opening 332 that exposes the top surface of the upper structure 620 is formed in the upper electrode 340 in the transmissive region 21 in the second module region 30. Accordingly, the upper electrode 340 has second openings 341 formed in the first module region 20 and the fourth opening 342 formed in the second module region 30, so that external light incident thereon can easily propagate through the transmissive regions 21 in the first module region 20 and the second module region 30.

Referring to FIGS. 9, 14, and 15, according to an embodiment, the upper substrate 450 is formed on the upper electrode 340, and the upper substrate 450 faces the lower substrate 110. The upper substrate 450 is formed from a material substantially the same as the material of the lower substrate 110. For example, the upper substrate 450 may be one of a quartz substrate, a synthetic quartz substrate, a calcium fluoride substrate, a fluorine-doped quartz substrate (F-doped quartz substrate), a soda lime glass substrate, a non-alkali glass substrate, etc.

According to an embodiment, the first functional module 410 overlaps the first module region 20 on a bottom surface of the lower substrate 110. The first functional module 410 can detect a surrounding environment or an image of an object on a top surface of the upper substrate 450 through the transmissive regions 21 in the first module region 20. In exemplary embodiments, the first functional module 410 is one of a face recognition sensor module, a pupil recognition sensor module, an acceleration sensor module, a geomagnetic sensor module, a proximity sensor module, an infrared sensor module, etc.

According to an embodiment, the second functional module 420 overlaps the second module region 30 on the bottom surface of the lower substrate 110. The second functional module 420 acquires an image of an object located on the top surface of the upper substrate 450 through the transmissive region 21 in the second module region 30. In exemplary embodiments, the second functional module 420 may be a camera module.

Accordingly, the OLED display device 600 shown in FIGS. 14 and 15 can be manufactured. As described above, the OLED display device 100 shown in FIGS. 10 and 11 and the OLED display device 500 shown in FIGS. 12 and 13 can also be easily manufactured by using the abrasion process.

In a method of manufacturing the OLED display device according to exemplary embodiments of the present disclosure, since the light emitting layer 330 and the upper electrode 340 are removed from the transmissive regions 21 in the first module region 20 and the second module region 30, external light incident thereon can easily propagate through the transmissive regions 21 in the first module region 20 and the second module region 30.

Embodiments of the present disclosure can be incorporated into various display devices that including an OLED display. For example, embodiments of the present disclosure can be incorporated into a vehicle-display device, a ship-display device, an aircraft-display device, a portable communication device, a display device for information transfer, a medical-display device, etc The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting diode display device, comprising:
    a lower substrate that includes a first module region and a display region that surrounds the first module region, wherein the first module region includes sub-pixel regions and transmissive regions and the display region includes the sub-pixel regions;
    a planarization layer disposed on the lower substrate;
    a plurality of lower electrodes respectively disposed on a top surface of the planarization layer in the sub-pixel regions in the first module region;
    a pixel defining layer disposed on the planarization layer and that covers both sides of each of the lower electrodes in the first module region, wherein the pixel defining layer includes an opening that exposes a top surface of the planarization layer in each of the transmissive regions in the first module region;
    a light emitting layer disposed on the lower electrodes, wherein the light emitting layer includes a first opening formed between two adjacent lower electrodes;
    an upper electrode disposed on the light emitting layer, wherein the upper electrode includes a second opening that overlaps the first opening;
    a lower spacer disposed in the opening of the pixel defining layer and on the planarization layer in each of the transmissive regions in the first module region; and
    a first functional module disposed on a bottom surface of the lower substrate in the first module region.

2. The organic light emitting diode display device of claim 1, wherein the first and second openings are located in the transmissive regions in the first module region.

3. The organic light emitting diode display device of claim 1, wherein the first and second openings expose the top surface of the planarization layer in each of the transmissive regions in the first module region.

4. The organic light emitting diode display device of claim 1, wherein
    the first and second openings expose a top surface of the lower spacer,
    the top surface of the lower spacer is located at a same level as a top surface of the pixel defining layer, and
    the light emitting layer and the upper electrode are disposed on at least a part of a side surface of the lower spacer.

5. The organic light emitting diode display device of claim 1, further comprising
    an upper spacer disposed on the lower spacer, wherein
    the first and second openings expose a top surface of the upper spacer,
    the top surface of the upper spacer is located at a higher level than a top surface of the pixel defining layer, and
    the light emitting layer and the upper electrode are disposed on at least a part of a side surface of each of the lower and upper spacers.

6. The organic light emitting diode display device of claim 1, wherein
    the lower substrate further includes a second module region spaced apart from the first module region and that includes the transmissive region, and
    the display region surrounds the second module region.

7. The organic light emitting diode display device of claim 6, further comprising
    a second functional module disposed on the bottom surface of the lower substrate in the second module region, wherein the transmissive region of the second module region corresponds to the second functional module.

8. The organic light emitting diode display device of claim 7, wherein
the first functional module is one of a face recognition sensor module, a pupil recognition sensor module, an acceleration sensor module, a proximity sensor module, an infrared sensor module, or an illuminance sensor module, and
the second functional module is a camera module.

9. The organic light emitting diode display device of claim 7, wherein
the light emitting layer includes a third opening formed in the second module region, and
the upper electrode includes a fourth opening in the second module region that overlaps the third opening,
wherein organic light emitting diode display device further includes:
a planarization layer disposed on the lower substrate; and
a pixel defining layer disposed on the planarization layer in the display region adjacent to the second module region.

10. The organic light emitting diode display device of claim 9, wherein the third and fourth openings expose a top surface of the planarization layer in the second module region.

11. The organic light emitting diode display device of claim 9, further comprising
a lower structure disposed on the planarization layer in the second module region.

12. The organic light emitting diode display device of claim 11, wherein
the third and fourth openings expose a top surface of the lower structure,
the top surface of the lower structure is located at a same level as a top surface of the pixel defining layer, and
the light emitting layer and the upper electrode are disposed on at least a part of a side surface of the lower structure.

13. The organic light emitting diode display device of claim 11, further comprising
an upper structure disposed on the lower structure, wherein
the first and second openings expose a top surface of the upper structure,
the top surface of the upper structure is located at a higher level than a top surface of the pixel defining layer, and
the light emitting layer and the upper electrode are disposed on at least a part of a side surface of each of the lower and upper structures.

14. The organic light emitting diode display device of claim 6, wherein
an image is displayed in the first module region and the display region, and
no image is displayed in the second module region.

15. The organic light emitting diode display device of claim 6, further comprising a plurality of semiconductor elements disposed between the lower substrate and the light emitting layer,
wherein no semiconductor elements are disposed in the transmissive regions and the second module region.

16. The organic light emitting diode display device of claim 1, further comprising:
a gate insulating layer disposed on the lower substrate;
an insulating interlayer disposed on the gate insulating layer;
a planarization layer disposed on the insulating interlayer; and
an upper substrate disposed on the planarization layer and that faces the lower substrate,
wherein external light is incident onto the first functional module by propagating through the upper substrate, the first and second openings, the planarization layer, the insulating interlayer, the gate insulating layer, and the lower substrate in the first module region.

17. An organic light emitting diode display device, comprising:
a lower substrate that includes a first module region, a second module region and a display region that surrounds the first module region and the second module region, wherein the first module region includes sub-pixel regions and transmissive regions, the second module region includes the transmissive regions, and the display region includes the sub-pixel regions;
a planarization layer disposed on the lower substrate;
a plurality of lower electrodes respectively disposed on a top surface of the lower substrate in the sub-pixel regions in the first module region;
a pixel defining layer disposed on the planarization layer in the display region adjacent to the second module region, wherein the pixel defining layer includes an opening that exposes a top surface of the planarization layer in the transmissive regions in the second module region;
a light emitting layer disposed on the lower electrodes, wherein the light emitting layer includes a first opening formed between two adjacent lower electrodes; and
an upper electrode disposed on the light emitting layer, wherein the upper electrode includes a second opening that overlaps the first opening,
wherein the first and second openings are located in the transmissive regions in the first module region.

18. The organic light emitting diode display device of claim 17, further comprising:
a first functional module disposed on a bottom surface of the lower substrate in the first module region; and
second functional module disposed on the bottom surface of the lower substrate in the second module region,
wherein the second module region is spaced apart from the first module region, and the transmissive region of the second module region corresponds to the second functional module.

* * * * *